United States Patent [19]

Yeh

[11] Patent Number: 5,023,694
[45] Date of Patent: Jun. 11, 1991

[54] SIDE WALL CONTACT IN A NONVOLATILE ELECTRICALLY ALTERABLE MEMORY CELL

[75] Inventor: Bing Yeh, Los Altos, Calif.

[73] Assignee: Xicor, Inc., Milpitas, Calif.

[21] Appl. No.: 227,811

[22] Filed: Aug. 3, 1988

[51] Int. Cl.⁵ .................. H01L 29/68; H01L 27/02; H01L 29/04; H01L 23/48
[52] U.S. Cl. .................. 357/54; 357/23.5; 357/23.6; 357/23.14; 357/41; 357/59; 357/71
[58] Field of Search ............ 357/23.5, 23.6, 23.14, 357/41, 59, 65, 71, 54

[56] References Cited

U.S. PATENT DOCUMENTS

| | | | |
|---|---|---|---|
| 4,274,012 | 6/1981 | Simko | 357/23.5 |
| 4,586,065 | 4/1986 | Neukomm | 357/23.5 |
| 4,599,706 | 7/1986 | Guterman | 357/45 |
| 4,649,414 | 3/1987 | Ueda et al. | 357/53 |
| 4,706,102 | 11/1987 | Pan et al. | 357/23.5 |
| 4,752,912 | 6/1988 | Guterman | 357/23.5 |
| 4,866,493 | 9/1989 | Arima et al. | 357/23.5 |
| 4,872,050 | 10/1989 | Okamoto et al. | 357/71 |

FOREIGN PATENT DOCUMENTS

| | | | |
|---|---|---|---|
| 60-226281 | 11/1985 | Japan | 357/23.5 |
| 61-131486 | 9/1986 | Japan | 357/23.5 |

OTHER PUBLICATIONS

K. Hirobe et al., "End Point Detection in Plasma Etching by Optical Emission Spetroscopy", *Journal of the Electro-Chemical Society* (Jan. 1980). vol. 127, 2 pages.
R. K. Ellis et al., "Electron Tunneling in Non-planar Floating Gate Memory Structure", *IEPM* 82 (Dec. 1982), pp. 745 & 752.
P. J. Marcoux et al., "Methods of End Point Detection for Plasma Etching", *Solid State Technology* (Apr. 1981), pp. 115-122.
T. C. Penn, "New Methods of Processing Silicon Slices", *Science*, vol. 208 (May 23, 1980), pp. 923-926.

*Primary Examiner*—J. Carroll
*Attorney, Agent, or Firm*—McCubbrey, Bartels, Meyer & Ward

[57] ABSTRACT

A nonvolatile integrated circuit memory cell (10) is provided which is smaller in size than conventional memory cells and uses only two layers of polysilicon with floating gate portion (50) of the memory cell formed partly from a first polysilicon layer (20) and partly from second polysilicon layer (26), contact between the two portions being made using residual polysilicon bridge or overlapping portion (34) between the two layers. The invention enables programming and erase tunneling oxides to be formed in a single step while maximizing the capacitive coupling between the floating gate (50) and the substrate (12) by forming a silicon dioxide layer (102) between the floating gate and substrate separately from formation of the programming (30) and erase (28) tunneling elements.

21 Claims, 12 Drawing Sheets

SIDE WALL CONTACT IN A NONVOLATILE ELECTRICALLY ALTERABLE MEMORY CELL

The present invention relates generally to an improved integrated circuit two layer polysilicon electrically erasable nonvolatile memory cell, and more particularly to a method and apparatus for forming a side wall contact between a portion of said first polysilicon layer and a portion of said second polysilicon layer in said cell.

BACKGROUND OF THE INVENTION

In the prior art, integrated circuit memory devices have been developed which store data for indefinite periods of time in the absence of electrical power being applied thereto and which also have the capability of selectively changing or programming the data stored therein. Of particular interest herein is a nonvolatile memory cell which utilizes a floating gate as the nonvolatile element. See, e.g., U.S. Pat. No. 4,314,265 which discloses a four polysilicon layer, floating gate nonvolatile memory cell, and U.S. Pat. No. 4,274,012 which discloses a three polysilicon layer, floating gate nonvolatile memory cell with substrate coupling. Either of these nonvolatile memory cells may be arranged, as is known in the art, to construct nonvolatile random access memories (NOVRAM's) and electrically erasable programmable read only memories (EEPROM's). See, e.g., U.S. Pat. No. 4,300,212, which discloses a NOVRAM device and U.S. Pat. No. 4,486,769, which discloses an EEPROM device.

In U.S. Pat. No. 4,274,012, for example, the disclosed nonvolatile memory cell has three layers of polysilicon, each layer being generally electrically isolated from the substrate and each other by silicon dioxide layers. The first polysilicon layer is a programming electrode. The second polysilicon layer is the floating gate. The floating gate has a portion capacitively coupled to the programming electrode to form a programming tunneling element in which electrons tunnel from the programming electrode to the floating gate. Another portion of the floating gate is capacitively coupled to a n-implant region in the p-type substrate. The n-implant region is a bias electrode. The third polysilicon layer, which is an erase/store electrode, is capacitively coupled to a portion of the floating gate to form an erase tunneling element in which electrons tunnel from the floating gate to the erase/store electrode. Another portion of the erase/store electrode is capacitively coupled to the bias electrode in the substrate.

To initiate tunneling, a high potential, such as 25 volts, is applied to the erase/store electrode while the programming electrode is held at a low potential, such as ground. The substrate bias electrode is caused to be held either at the low potential of the programming electrode or held at the high potential of the erase/store electrode, depending on whether electrons are to be tunneled from or to the floating gate, respectively. With the bias electrode held at the high potential, since the floating gate is being strongly capacitively coupled to the bias electrode, it is elevated to the high potential. Therefore, high potential exists across the programming tunneling element between the programming electrode and the floating gate so that electrons are tunneled onto the floating gate. Conversely, with the bias electrode held at the low potential, the floating gate will also be at the low potential because of the strong capacitive coupling to the bias electrode. Therefore, high potential exists across the erase tunneling element between the floating gate and the erase/store electrode. Electrons will then tunnel from the floating gate to the erase/store electrode. An article which describes electron tunneling structures and operation in greater detail is entitled "Electron Tunneling in Non-Planar Floating Gate Memory Structures", R. K. Ellis, et al., published in the 1982 *International Electron Devices Meeting (IEDM) Technical Digest*, pages 749-756.

A serious drawback of prior art nonvolatile memory cells as described above is that they do not easily scale to smaller and smaller sizes. There is an ongoing desire to increase the number of memory cells that can be fabricated on an individual chip so as to increase memory density and/or chip yield per wafer. However, the simple miniaturization of the nonvolatile memory cell does not allow the necessary capacitive values and relationships to be maintained for an operational memory device. Furthermore, the overhead requirements of a separate and distinct bias electrode region for a write operation, and floating gate channel region for a read operation, combined with inherent tolerance requirements needed to prevent disturb conditions in memory cells adjacent to the cell whose state is being changed, makes it impractical to shrink such prior art nonvolatile memory cells sufficiently for very high density applications.

A nonvolatile memory which improves on the above described semiconductor memory cells is described in U.S. Pat. No. 4,599,706 to Guterman. This latter memory cell reduces the number of capacitive couplings in the memory cell, since it contained fewer elements, thereby improving device operation. This is because such capacitive couplings introduce losses in obtaining the voltage relationships necessary to induce tunneling of electrons between the polysilicon layers.

Furthermore, device operation and cell dimensions are optimized in this improved memory cell due to its reduced component count and the reduced number of cycles required for a write operation. For example, in an EEPROM version of this improved memory cell, a write cycle that programs the floating gate can be completed in a single cycle. Prior art EEPROM's required an unconditional erase prior to each write cycle.

The nonvolatile memory cell disclosed in U.S. Pat. No. 4,599,706 includes three electrically isolated polysilicon layers, generally as described hereinabove. That is, the first layer forms the programming electrode, the second layer forms the floating gate, and the third layer forms the erase/store electrode. More specifically, a first portion of the second layer is capacitively coupled to the first layer to form a first tunneling element therebetween, and a second portion of the second layer is capacitively coupled to a substrate region of opposite conductivity to the substrate. A third polysilicon layer is capacitively coupled to the second layer to form a second tunneling element. In operation, a reference potential is applied to the first layer. A voltage representative of the data state to be stored by the charge on the second layer is applied to another substrate region of opposite conductivity to the substrate type. The third layer forms the gate of an enhancement mode transistor between each substrate region. Upon application of a selected potential to the third layer, the transistor is turned on to create a conductive path between each substrate region. If the data state voltage is similar to the potential applied to the third layer, electrons will tunnel from the first layer to the second layer leaving the second layer with a net negative charge. Conversely, if the data state voltage is significantly less than the voltage of the potential applied to the third layer, electrons will tunnel from the second layer to the third layer leaving the second layer with a net positive charge.

Thus, an advantage of the device disclosed in U.S. Pat. No. 4,599,706 over prior art devices is that it eliminates the need for capacitive coupling between the third polysilicon layer, the erase/store electrode, and the bias electrode. The transistor switch needed to control the potential of the bias electrode in the nonvolatile cell of the NOVRAM device is also eliminated.

Other limitations still exist with regard to using a three layer polysilicon memory cell as taught in U.S. Pat. No. 4,599,706. The need for three layers of polysilicon results in a surface topology in the resultant memory that has a number of large steps, creating a coverage problem in later processing. Furthermore, the step height cannot be greater than the depth of focus of the apparatus used for forming the memory cell and this is a limitation on the degree of the step height. Scalability is also limited by a polysilicon stringer phenomenon which occurs especially when there are large step heights in the cell being formed. The poly stringer is that portion of the polysilicon layer that is not removed easily during anisotropic etching without over etching. This also puts limitations on the size of the cell.

Furthermore, the need for forming additional silicon dioxide layers in the cell after a given polysilicon layer has been formed creates encroachment of the oxide into the region of the silicon dioxide layer which defines the tunneling element between two layers of polysilicon. Each time a new silicon dioxide layer is formed, the reoxide encroachment of exposed silicon dioxide will become more severe. This reoxide encroachment causes the gap between the two layers of polysilicon to increase, thereby changing the tunneling characteristics across this gap. Since the overlap between polysilicon tunneling elements dictates the minimum cell size, the cell size is limited by this phenomenon. Thus, a three layer polysilicon cell requires more overlap of adjacent layers than a two layer cell because of the greater number of silicon dioxide layers that must be formed in creating the three polysilicon layer structure, and thus the greater reoxide encroachment degradation of the overlapping tunneling element between the first and second polysilicon layers.

In addition, since the operation of a cell is based on specific coupling capacitance ratios defined in the cell, the size of these capacitances also places constraints on the size of the cell. This is because, in order to make the memory cell work, the proportionalities between the capacitances must remain constant. That is, the relationship between the capacitances determines the tunneling coupling which in turn determines the program/erase window of the memory cell. The program/erase window is defined to be the difference between the positive potential on the floating gate when the floating gate has been erased and the level of negative potential on the floating gate when the floating gate has been programmed. The result is an endurance curve which tends to degrade as the number of programming cycles experienced by the floating gate increases. Therefore, if one capacitance value is increased, the others must be changed accordingly. Since a larger coupling capacitance value results from a greater amount of polysilicon layer overlap, the above-described need to maintain a certain minimum amount of layer overlap in order to protect against reoxide encroachment degradation results in the three layer polysilicon cell topology also being less easy to scale down in size due to this interdependence of cell capacitances.

Furthermore, there is little flexibility in the selection of silicon dioxide thickness between adjacent polysilicon layers in the above mentioned three layer polysilicon cell because of reliability problems in the operation of the tunneling mechanism for reduced thickness. Further, since the oxide layer under the floating gate layer is grown at the same time as the tunneling oxide layer between the first polysilicon layer and the floating gate layer in the three layer polysilicon cell, the silicon dioxide thickness of the oxide layer under the floating gate cannot be reduced arbitrarily in order to improve the coupling from the substrate channel to the floating gate. As cell dimensions are reduced laterally without scaling these oxide thicknesses, then the program/erase window also gets smaller and smaller. The capacitive coupling limitations also necessitate higher voltages than would otherwise be necessary. Therefore, it becomes more valuable as the cell is scaled down in size to separate the coupling oxide thickness from being dependent on tunneling oxide thickness. That is, it is advantageous to have a thin coupling oxide and a thick tunneling oxide to create the highest capacitive coupling ratios and thus the lowest possible operating voltage.

It is also important that the memory cell not be alignment sensitive. A difficulty with three layer polysilicon cells is that there are more critical alignment processing steps than would be required in a two layer cell and the silicon dioxide tunneling elements in the programming and erase sides of the floating gate are formed at different times. Since these regions are not matched, the program/erase window is reduced in size, and consequently the cell lifetime is reduced.

SUMMARY OF THE INVENTION

It is therefore an object of the present invention to provide a nonvolatile memory cell which is smaller than known nonvolatile memory cells.

It is another object of the present invention to provide a nonvolatile memory cell which utilizes fewer components or elements than known memory cells.

A further object of the present invention is to provide a method and means for forming a side wall contact between a first layer of polysilicon formed on a substrate and a second polysilicon layer formed on said substrate.

Another object of the present invention is to provide a nonvolatile memory cell which uses only two layers of polysilicon, with the floating gate portion of the memory cell being partly formed from the first polysilicon layer, and partly formed from the second polysilicon layer. Contact between the two portions is by a side wall contact either formed by a residual poly stringer "bridge" or by an overlapping portion between the two layers.

Yet another object of the present invention is to enable the tunneling oxide between the programming electrode and the floating gate and between the floating gate and the erase electrode to be formed during a single processing step.

A further object of the present invention is to maximize the capacitive coupling between the floating gate and the underlying substrate by forming the silicon dioxide layer between the floating gate and the substrate separately from formation of the programming and erase tunneling elements.

Yet another object of the present invention is to provide a nonvolatile memory cell that minimizes step height across the surface of the cell, resulting in a cell topology that maximizes density of the memory cells.

Yet another object of the present invention is to provide a nonvolatile memory cell including a doped region or paddle in the substrate beneath the floating gate and having this paddle be self-aligned with the floating gate, to thereby enable the maximizing of memory cell density.

Broadly stated, the present invention comprises an integrated circuit device including a substrate of a first conductivity type having a first surface, a first conducting layer having a region that is spaced from said first surface, said region having a planar bottom surface substantially parallel to said substrate surface and having at least one side wall substantially perpendicular to said bottom surface, and a second conducting layer having a surface in contact with said first conducting layer, wherein said surface of said second layer contacts said side wall of said first layer.

More specifically, according to the present invention, an integrated circuit nonvolatile floating gate memory device comprises a substrate of a first conductivity type having a first surface, a first substrate region and a second substrate region, each said substrate region being disposed in said first surface and being of a second conductivity type opposite said first conductivity type; means for selectively applying one of a first data potential and a second data potential to said first substrate region, said first data potential being applied when data to be stored in said device has one binary state, said second data potential being applied when data to be stored in said device has the other binary state; a first electrically insulated polysilicon layer spaced from said first surface, and including a first portion capacitively coupled to said second substrate region and a second portion electrically insulated from said first portion, said first portion having a planar bottom surface spaced from said substrate and having at least one side wall substantially perpendicular to said bottom surface; a second electrically insulated polysilicon layer having a first portion extending between said first substrate region and said second substrate region and being spaced from said first surface and being capacitively coupled to said first portion of said first polysilicon layer, and a second portion electrically insulated from said first portion of said second polysilicon layer, said second portion of said second polysilicon layer being capacitively coupled to said second portion of said first polysilicon layer and having at least one surface in electrical contact with said side wall; means for selectively applying a first bias potential to said second portion of said first polysilicon layer; means for selectively applying a first control potential to said first portion of said second polysilicon layer, said first control potential being selected to invert the conductivity type of said substrate between each said substrate region to said second conductivity type to electrically conduct the potential of said first substrate region to said second substrate region, said control potential, said data potential and said bias potential being selected so that electrons are introduced onto said second portion of said second polysilicon layer from said second portion of said first polysilicon layer upon application of said first data potential to said first substrate region and said control potential to said first portion of said second polysilicon layer for storing said one binary state, and further selected so that electrons are removed from said first portion of said first polysilicon layer upon application of said second data potential to said first substrate region and said control potential to said first portion of said second polysilicon layer for storing said other binary state; and means for sensing the potential of said first portion of said first polysilicon layer.

In said two polysilicon layer memory cell, said second portion of said first layer comprises the programming electrode of the memory cell, the first portion of said first layer and the second portion of said second layer comprises the floating gate of said memory cell, and the first portion of said second layer comprises an erase electrode for said memory cell.

According to an alternate embodiment of said memory device, the boundaries of said second substrate region are aligned with the boundaries of said first portion of said first polysilicon layer. According to a further embodiment of said memory device, said second substrate region is omitted.

A method according to the present invention for forming a nonvolatile floating gate memory cell on a silicon substrate comprises the steps of forming a first layer of silicon dioxide of a predetermined thickness on said substrate; forming a first polysilicon layer on the top of said first silicon dioxide layer; forming a first layer of nitride and then a second layer of silicon dioxide on the surface of said first polysilicon layer of a predetermined thickness sufficient to block ion implantation in the substrate beneath said silicon dioxide layer; masking the surface of said first nitride and second silicon dioxide layers everywhere except where first and second portions of said first polysilicon layer are to be formed; removing said exposed portions of said first nitride and second silicon dioxide layers; forming a first mask over the exposed portion of said first polysilicon layer corresponding to where a second portion of said first polysilicon layer is to be formed; implanting a doped region in the substrate beneath said first polysilicon layer in the exposed region thereof corresponding to a first portion of said first polysilicon layer; removing said first mask and said second silicon dioxide layer; thermally growing a third silicon dioxide layer on the exposed surface of said first polysilicon layer; removing said nitride layer and all of said first polysilicon layer not masked by said third silicon dioxide layer, thereby forming said first and second portions of said first polysilicon layer; forming a fourth silicon dioxide layer to cover the side walls of said first and second portions of said first polysilicon layer; depositing a thin masking layer and then removing a portion thereof so as to expose the top of said first and second portions; desensitizing said masking layer so that a second masking layer can be added; depositing a second masking layer to mask everywhere except where a side wall contact is to be formed between said first portion of said first polysilicon layer and a second polysilicon layer; removing a predetermined portion of the exposed portions of said third and fourth silicon dioxide layers so as to expose a portion of the side wall of said first portion of said first polysilicon layer; removing said thin masking layer and said second masking layer; forming said second polysilicon layer on all surfaces; and masking said second polysilicon layer to form a first portion partially overlying said first portion of said first polysilicon layer and partially overlying said first oxide layer and a second portion in contact with said first portion of said first polysilicon layer at the exposed side wall thereof and partially overlying said second portion of said first polysilicon layer.

In a second embodiment of the above method, the side wall contact between the first portion of said first polysilicon layer and the second portion of said second polysilicon layer is formed, after the first and second portions of said first polysilicon layer are formed as defined above, by forming a second nitride layer on all exposed surfaces; removing said second nitride layer in all areas except for the side wall portions of said first polysilicon layer; forming a mask over one side wall of said first portion of said first polysilicon layer; removing all side wall nitride not protected by said mask; removing said mask; and forming a fourth silicon dioxide layer on all exposed surfaces except for the exposed side wall surface containing said remaining side wall nitride; removing said remaining nitride side wall. Thereafter, the second polysilicon layer is formed as described above in the first method embodiment.

According to a third embodiment of the above method, the self-aligned feature of the doped region in the substrate is eliminated, thereby simplifying the processing according to the present invention. Specifically, in this embodiment, the formation of the first nitride and the second layer of silicon dioxide are eliminated, as well as the associated oxidation and etching steps described previously. The doped second substrate region is implanted prior to the formation of the first polysilicon layer.

Furthermore, the above described second substrate region may be eliminated altogether according to another embodiment of the present invention. In this embodiment, the capacitive relationships required to induce tunneling between the programming electrode and the floating gate or between the floating gate and the erase electrode are determined by the capacitance inherent between the floating gate and the substrate itself. The advantage of eliminating this second substrate region (thereby creating a paddleless memory cell) is that the processing steps are even simpler than the non-self aligned paddle case, since it further eliminates the masking and implantation steps for forming the second substrate region. The disadvantage is that the capacitive constraints of this cell make it less scalable than when a second substrate region is formed. A memory cell of minimum size would need to use said second substrate region, and said region would need to be self-aligned with the floating gate that is subsequently formed on top of this region.

These and other objects and advantages of the present invention will become more apparent from the following specification when read in conjunction with the accompanying drawings and appended claims.

DESCRIPTION OF THE PREFERRED EMBODIMENTS

I. The Apparatus

Figure 1:
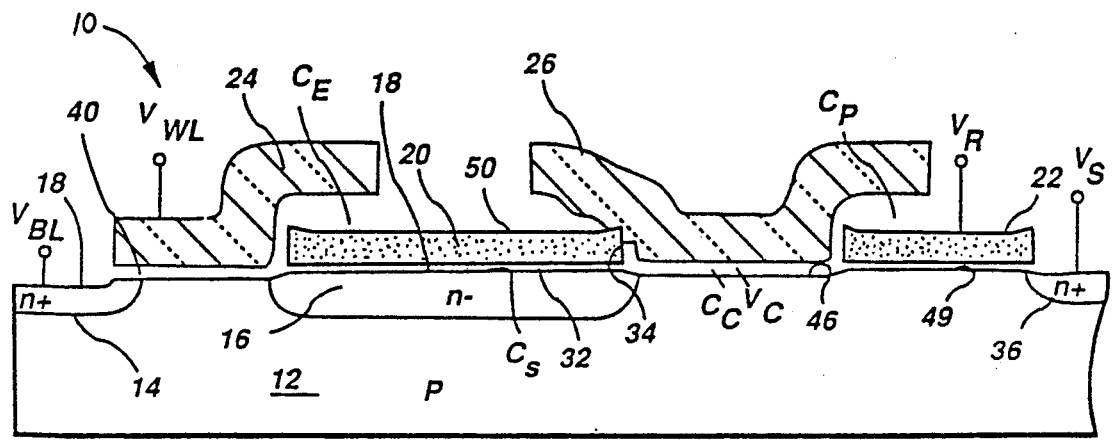
FIG. 1 is a schematic cross-sectional view of a nonvolatile memory cell constructed according to the present invention.
Figure 2:
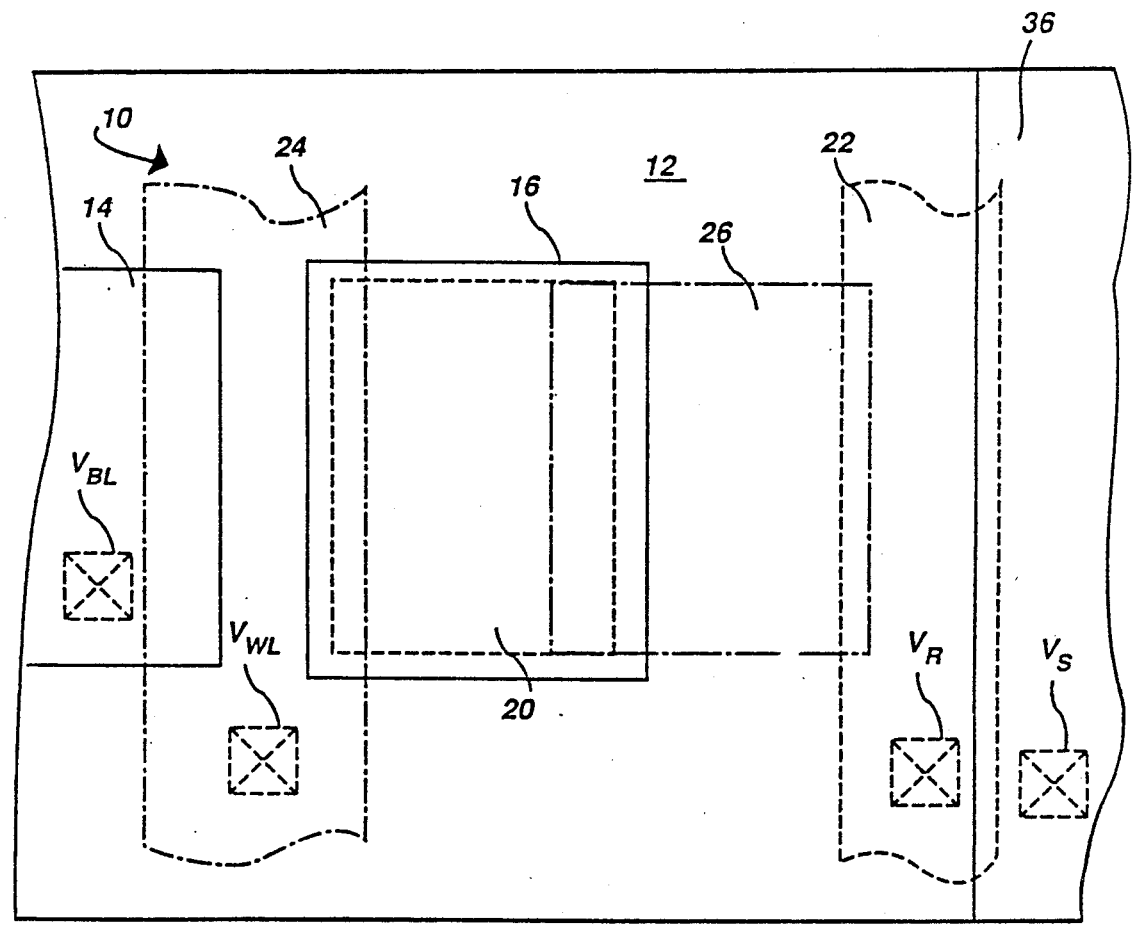
FIG. 2 is a plan view of the memory cell of FIG. 1.
Figure 3:
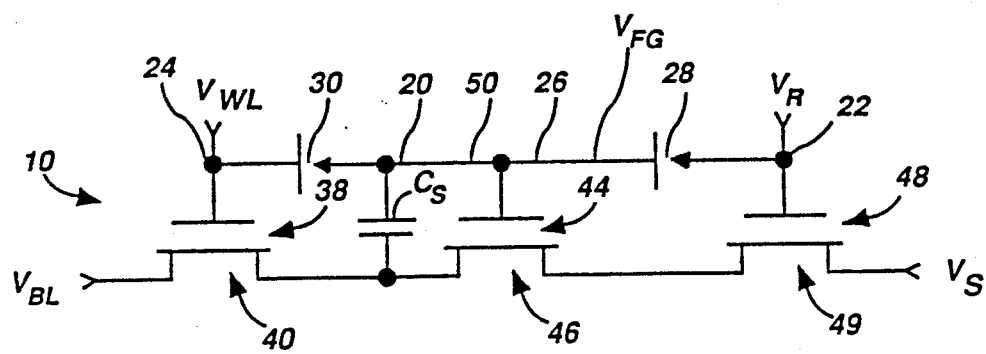
FIG. 3 is an equivalent electrical circuit of the nonvolatile memory cell illustrated in FIG. 1.

A. Memory Cell with Self-Aligned Paddle and Floating Gate Overlap:

Referring now to FIGS. 1-3, there is shown a nonvolatile memory cell 10 constructed according to the present invention. Memory cell 10 includes a substrate 12 of a first conductivity type, a first substrate region 14, a second substrate region 16, and a surface 18. Each substrate region 14 and 16 is disposed in surface 18 and is of a second conductivity type opposite the first conductivity type of substrate 12.

Memory cell 10 also includes a first electrically insulated polysilicon layer spaced from surface 18 including a first portion 20 and a second portion 22, and a second electrically insulated polysilicon layer spaced from said surface 18 including a first portion 24 and a second portion 26. The first portion 24 of said second layer extends between first substrate region 14 and second substrate region 16 and is capacitively coupled to said first portion 20 of said second portion 26 of said second layer is in electrical contact with side wall 34. As seen in said first layer. The first portion 20 of said first layer includes a bottom surface 32 adjacent surface 18 and a side wall 34 that is substantially perpendicular to said bottom surface 32. At least one surface of said second portion 26 of said second layer is in electricl contact with side wall 34. As seen in FIG. 1, a portion of second portion 26 may overlap first portion 20 and may be in contact with a top surface thereof so as to form a corner contact. Second portion 26 is also capacitively coupled to the second portion 22 of said first layer.

The first portion 20 of said first polysilicon layer is also capacitively coupled to second substrate region 16. This capacitive coupling between first portion 20 and second substrate region 16 is schematically illustrated in FIG. 3 as capacitance $C_S$. Preferably, to maximize capacitive coupling between said first portion 20 and substrate region 16, the first portion 20 and substrate region 16 are formed during processing to be self-aligned to each other. Note however, that having the substrate region 16 not be self-aligned with the first portion 20 is still within the scope of the present invention.

The capacitive coupling between the first portion 24 of said second layer and the first portion 20 of said first layer is best seen in FIG. 3 as tunneling element 30. The capacitive coupling between the second portion 22 of said first layer and the second portion 26 of said second layer is best seen in FIG. 3 as tunneling element 28.

Substrate 12 further includes a third substrate region 36 of the second conductivity type. The second portion 22 of said first polysilicon layer and third substrate region 36 extend generally parallel with each other as best seen in FIG. 2.

As best seen in FIG. 3, first portion 24 of said second polysilicon layer forms the gate of an insulated gate enhancement mode transistor 38, having a channel 40 disposed between first substrate region 14 and second substrate region 16. These latter substrate regions 14, 16 form the drain and source of transistor 38, respectively. The second portion 26 of said second polysilicon layer forms the gate of an insulated gate transistor 44, also referred to herein as the floating gate transistor, and overlies a channel 46. Transistor 44 is an enhancement mode transistor in the present embodiment but could also be a depletion mode as well if performance adjustments are needed. Second substrate region 16 forms the drain of transistor 44. The second portion 22 of said first polysilicon layer forms the gate of a enhancement mode transistor 48. Transistor 48 could also be a depletion mode transistor as well if performance adjustments are needed. Third substrate region 36 forms the source of transistor 48. Second portion 22 of said first polysilicon layer overlies a channel 49 of transistor 48. Transistor 44 and transistor 48 are equivalent to a single enhancement (or depletion, if so used) mode transistor having two adjacent gates, wherein second portion 26 of said second polysilicon layer forms one gate and said second portion 22 of said first polysilicon layer forms a second gate adjacent the first gate thereof.

Turning now to the operation of this nonvolatile memory cell 10, the mechanism for tunneling of electrons across tunneling elements 28 and 30 is well known in the art. For example, U.S. Pat. No. 4,274,012 (the '012 patent) describes such tunneling through the oxide layers which separate the polysilicon layers. It is of course understood that FIG. 1 in the present case is diagrammatic in illustrating the nonvolatile cell. Not shown in detail are oxide or other dielectric layers which are grown or deposited on the substrate and on each polysilicon layer during the fabrication of cell 10 to electrically isolate it from the next level of polysilicon material deposited on the device. According to the preferred embodiment of the present invention, the thickness of the oxide at the tunneling region is between 500 Angstroms and 800 Angstroms.

Referring now to FIG. 1 and FIG. 3, a bias potential $V_R$ is applied to second portion 22 of said first polysilicon layer and a reference potential $V_S$ is applied to third substrate region 36. For high voltage power considerations during tunneling of electrons across either tunneling element 28 or tunneling element 30, the bias potential of said second portion 22, which forms the gate of transistor 48, and the reference potential of third substrate region 36, which forms the source of transistor 48, are selected so that no current is developed in channel 49 between floating gate transistor 44 and third substrate region 36 in either direction. Accordingly, the gate-source voltage, given by $V_R - V_S$, of transistor 48 is normally biased negatively in a preferred embodiment of the present invention during tunneling so that transistor 48 remains in a "cutoff" condition.

A data potential $V_{BL}$ is applied to first substrate region 14 whose level represents the data state to be stored in floating gate 50, which comprises the first portion 20 of said first polysilicon layer and the second portion 26 of said second polysilicon layer. For example, the first binary state may be represented by a low potential and the other binary state may be represented by a high potential. Concurrently with applying the data potential $V_{BL}$ to first substrate region 14, a control potential $V_{WL}$ is applied to the first portion 24 of said second polysilicon layer. The control potential $V_{WL}$ is selected to invert the conductivity of channel 40 sufficiently to conduct the full data potential $V_{BL}$ applied to first substrate region 14 to second substrate region 16 through turned on transistor 38. The control potential $V_{WL}$ and the data potential $V_{BL}$, when $V_{BL}$ is in a high data potential state, are selected to ensure that sufficient potential difference exists across the tunneling element 28 so that electrons tunnel to floating gate 50. With control potential $V_{WL}$ set at the level just described, the data potential $V_{BL}$, when $V_{BL}$ is in a low data potential state, is selected so that sufficient potential difference exists across tunneling element 30 so that electrons may tunnel from floating gate 50 to the first portion 24 of said second polysilicon layer.

For example, when the data potential $V_{BL}$ applied to first substrate region 14 is high and a sufficiently high control potential $V_{WL}$ is applied to first portion 24 of said second polysilicon layer, the data potential $V_{BL}$ is propagated to second substrate region 16, causing substrate 16 to also attain a high potential so that little potential difference exists between first portion 24 and second substrate region 16. Floating gate 50 will also reach a high potential because of the capacitive coupling of capacitor $C_s$ and the capacitive effects of tunneling element 30 and channel 46. As the potential of floating gate 50 goes high, little potential difference will exist across tunneling element 30 and a large potential difference will then exist across tunneling element 28. Consequently, electrons will tunnel from the second portion 22 of said first polysilicon layer to floating gate 50.

Conversely, when the data voltage $V_{BL}$ is low, the potential of second substrate region 16 is also low. The capacitance $C_s$ between first portion 20 of floating gate 50 and second substrate region 16 as well as the capacitive effects of tunneling element 28 and channel region 46 will capacitively hold the floating gate 50 low upon application of the control potential $V_{WL}$ to the first portion 24 of said second layer. Therefore, the potential difference across tunneling element 28 is small and the potential difference across tunneling element 30 is large. As a result, electrons will tunnel from floating gate 50 to said first portion 24.

The nonvolatile memory cell 10 in accordance with the invention can be used to form a memory array such as an electrically alterable read only memory array with the addition of commonly known decoding and buffering systems in such memory devices.

Figure 4:
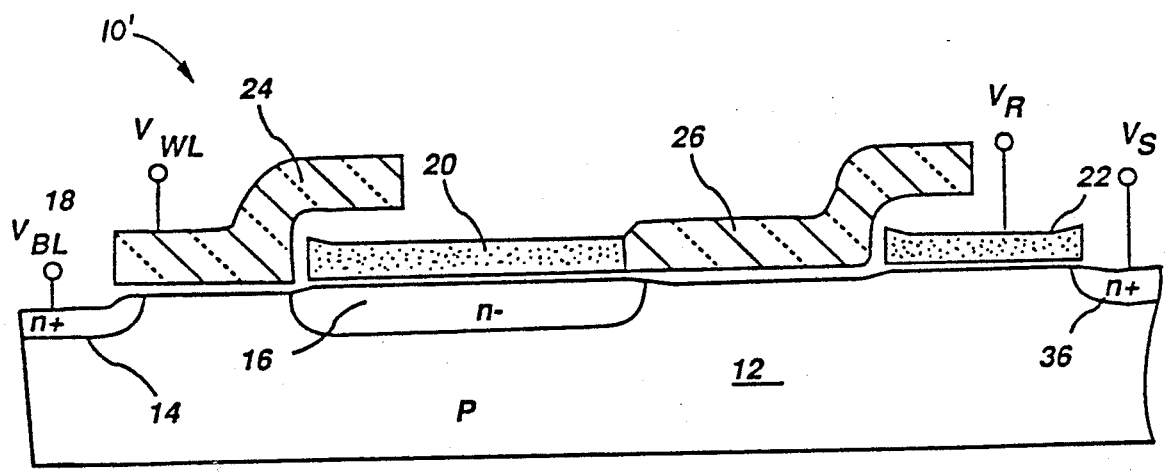
FIG. 4 is a schematic cross-sectional view of another embodiment of a nonvolatile memory cell according to the present invention.
Figure 5:
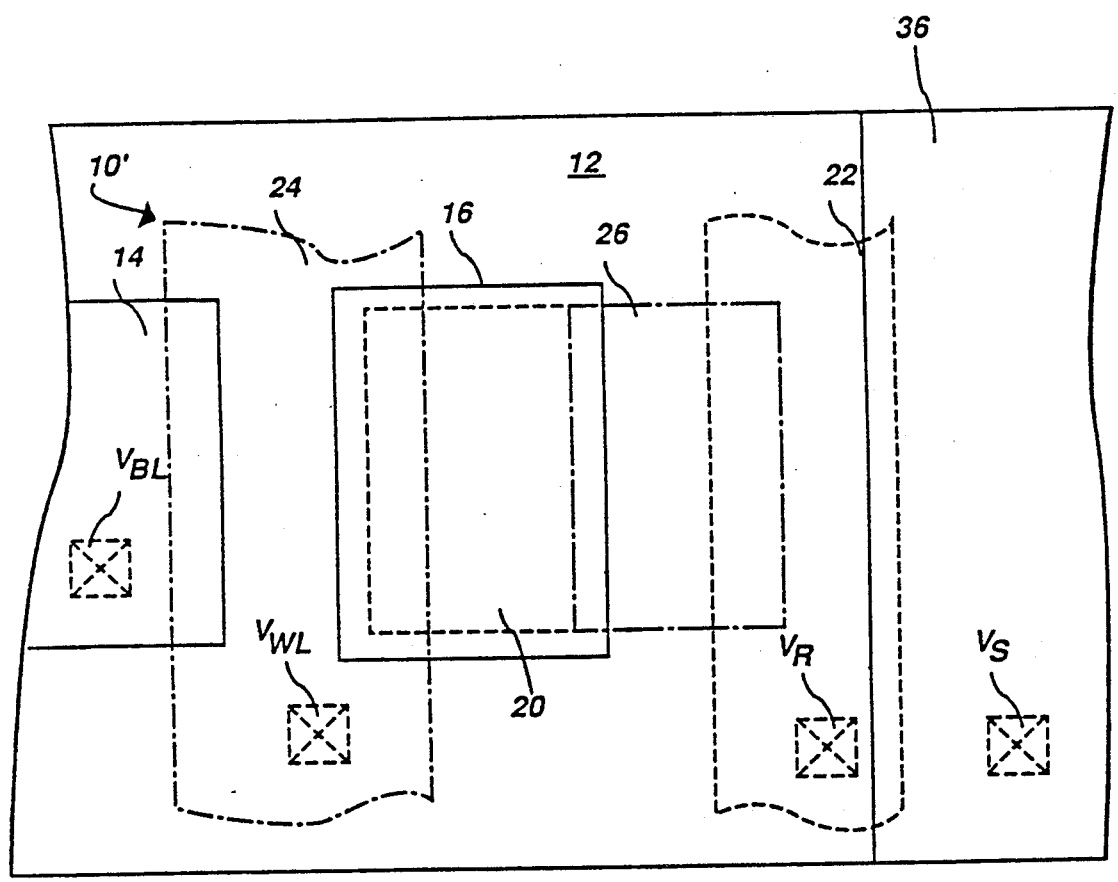
FIG. 5 is a plan view of the memory cell of FIG. 4.

B. Memory Cell with Self-Aligned Paddle and Floating Gate Bridge:

FIG. 4 is a schematic cross-sectional view of another embodiment of a nonvolatile memory cell according to the present invention, and FIG. 5 is a plan view of this memory cell. The memory cell 10' in these FIGS. shows that the second portion of said second layer can be formed without any of it overlying the first portion of said first layer. That is, the vertical plane defined by the side wall of the first portion of said first layer is not crossed by the second portion of the second layer. This is accomplished by using end point detection to stop the etch at a predetermined point before the entire exposed portion of the second polysilicon layer is etched away, then followed by another masking and etching operation to remove the unwanted polysilicon "stringers". The benefit of this approach is that it creates a cell that is more compact and planarized than would otherwise be possible. Two articles discuss various methods of end point detection. These are "Methods of End Point Detection for Plasma Etching", Paul J. Marcoux and Pang Dow Foo, *Solid State Technology*, April 1981 and "End Point Detection in Plasma Etching by Optical Emission Spectroscopy", Kadou Hirobe and Takashi Tsuchimoto, *Journal of the Electrochemical Society: Solid State Science and Technology*, January 1980.

Figure 6A:
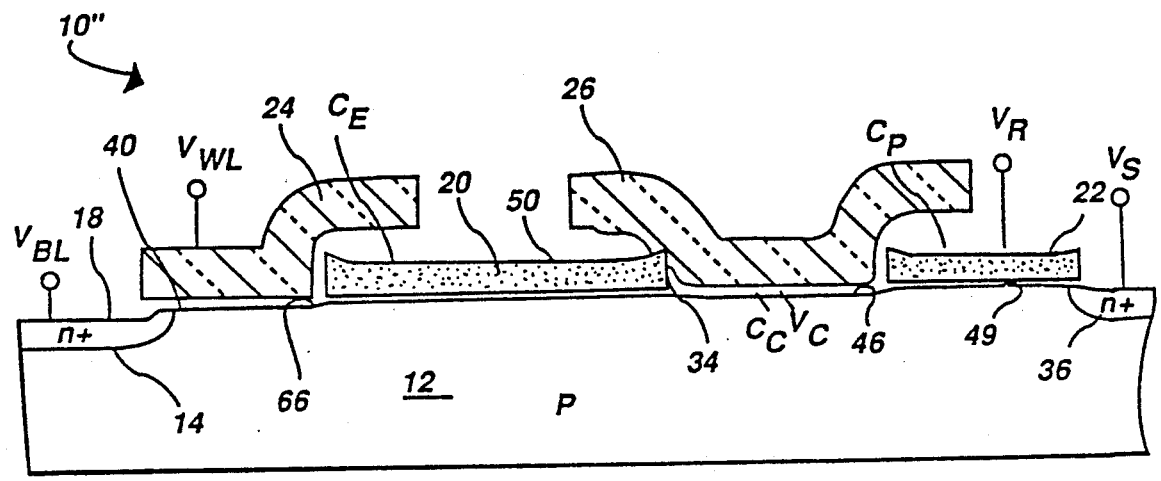
FIGS. 6A and 6B illustrate alternative schematic cross-sectional views of a third embodiment of a nonvolatile memory cell according to the present invention.
Figure 6B:
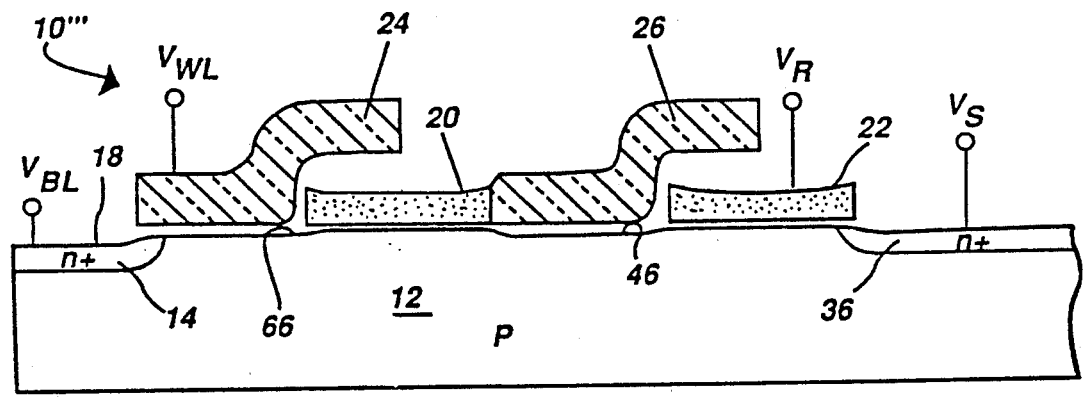
Figure 10:
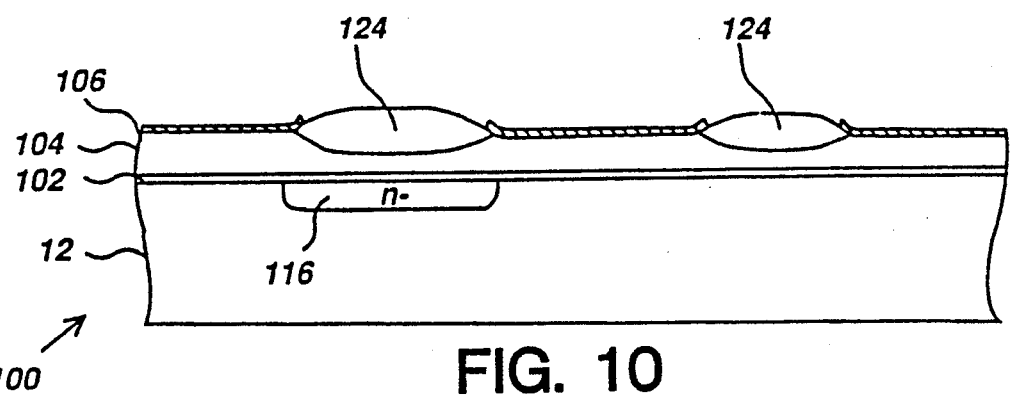

C. Memory Cell without Paddle:

Referring now to FIGS. 6A and 6B, there are shown second alternate embodiments of a nonvolatile memory cell 10″ in FIG. 6A and 10‴ in FIG. 6B. Identical reference numerals are used in FIGS. 6A and 6B to identify the identical components described above in conjunction with nonvolatile memory cell 10 with reference to FIGS. 1–3. FIG. 6A illustrates a cell as in FIG. 1 with an overlapping area between said second portion 26 of said second polysilicon layer and said first portion of said first polysilicon layer. FIG. 6B illustrates a cell as in FIG. 4.

The only difference in fabrication between the nonvolatile memory cell 10 and the cell 10″ in FIG. 6A or cell 10′ and the cell 10‴ in FIG. 6B is the elimination of processing steps involved in forming the paddle, i.e., the second substrate region 16. Although this results in a process simplification that is desirable for many applications, it reduces the ability to scale downward the size of the memory cell as compared with cells which include a paddle. Specifically, in a padless cell, the programming margin is reduced, as discussed in greater detail below, thereby limiting reduction in cell size.

Further according to alternate embodiments 10″ and 10‴, instead of having second substrate region 16 form a conduction path between transistors 38 and 44, a virtual junction 66 is formed therebetween, connecting the channel region 40 of transistor 38 and the channel region 46 of transistor 44. Thus, transistors 38, 44 and 48 are equivalent to a triple gate enhancement mode transistor.

D. Capacitive Relationships:

Referring now in greater detail to the operational characteristics of nonvolatile memory cell 10 of FIGS. 1–3, the tunneling element can be thought of as a voltage actuated switch having zero conduction for a voltage less than $V_X$ and a very high conduction for a voltage greater than or equal to $V_X$. At programming of floating gate 50, when steady state is reached, the floating gate potential $V_{FG}$ is given approximately by the equation:

$$V_{FG}(0) = (C_E V_{WL} + C_S V_{BL} + C_C V_C + C_P V_R + Q_{FG}(0))/\Sigma C \quad (1)$$
$$= V_R + V_X$$

where $C_P$ is the capacitance of tunneling element 28, $C_E$ is the capacitance of tunneling element 30, $C_S$ is the steering capacitor between the floating gate 50 and the second substrate region 16, $C_C$ is the channel capacitance between the substrate and the portion of the floating gate formed by the second portion 26 of the second polysilicon layer, $V_{WL}$ is the word line voltage (control potential), $V_{BL}$ is the bit line voltage (high potential state of one data potential), $V_R$ is the ground deselect line voltage (reference potential), $V_C$ is the channel surface potential, and $$\Sigma C = C_E + C_S + C_P + C_C$$

At erasing of floating gate 50, when steady state is reached, the floating gate potential $V_{FG}$ (assuming low data potential state to be 0 volt) is given approximately by the equation:

$$V_{FG}(1) = (C_E V_{WL} + C_P V_R + Q_{FG}(1))/\Sigma C = V_{WL} - V_X \quad (2)$$

Therefore, after programming, the floating gate potential, defined as $Q_{FG}(0)/\Sigma C$, can be derived from equation (1), resulting in the following equation:

$$Q_{FG}(0)/\Sigma C = V_R + V_X - (C_E V_{WL} + C_S V_{BL} + C_C V_C + C_P V_R)/\Sigma C \quad (3)$$

Similarly, after the floating gate is erased, the floating gate potential, defined as $Q_{FG}(1)\Sigma C$, can be derived from equation (2) resulting in the following equation:

$$Q_{FG}(1)/\Sigma C = V_{WL} - V_X - (C_E V_{WL} + C_P V_R)/\Sigma C \quad (4)$$

As defined above, the program/erase window is defined to be the difference between the positive potential on the floating gate when the floating gate has been erased and the level of negative potential on the floating gate when the floating gate has been programmed. Consequently, the size of the program/erase window is defined by the following equation:

$$\Delta Q_{FG}/\Sigma C = Q_{FG}(1)/\Sigma C - Q_{FG}(0)/\Sigma C = (V_{WL} - V_R) - 2V_X + (C_S V_{BL} + C_C V_C)/\Sigma C \quad (5)$$

In simplifying equation (5), it is noted that the term $V_{WL} - V_R$ is typically chosen to be approximately two times $V_X$. Thus, for example, if $V_X$ is approximately 11 volts, $V_{WL}$ is approximately 19 volts and $V_R$ is approximately $-3$ volts, the equation $V_{WL} - V_R - 2V_X$ is approximately equal to 0 volts. Therefore, it is a good approximation to assume that the program/erase window size can be expressed as follows:

$$\Delta Q_{FG}/\Sigma C = (C_S V_{BL} + C_C V_C)/\Sigma C \quad (6)$$

At programming, since $V_C$ is a function of $V_{BL}$, we can select $V_C$ to be approximately 0.5 $V_{BL}$. This enables equation (6) to be simplified as follows:

$$\Delta Q_{FG}/\Sigma C = (C_S + 0.5 C_C)/\Sigma C) V_{BL} = \text{(Capacitance Coupling efficiency)} V_{BL} \quad (7)$$

Equation (7) shows that the program/erase window size is determined by the ratio of the expression $C_S + 0.5 C_C$ to the total capacitance of the memory cell, which is equal to the sum of $C_P$, $C_E$, $C_S$ and $C_C$. It can be seen from this equation that in order to increase the program/erase window of a paddle cell, whether the paddle is self-aligned or not, it is desirable that the capacitance coupling efficiency to be as close to 100% as possible. That is, $C_S + C_C$ should be much larger than $C_P$ and $C_E$.

$C_P$ (or $C_E$) is determined by the overlap area between the first and second polysilicon layers as well as the oxide thickness in the side wall and top side of the first polysilicon layer. To maximize the program/erase window, it is preferred to:
1. minimize the overlap up to the point just before reoxide enchroachment becomes a problem.
2. minimize the first polysilicon layer's thickness to reduce side wall area contribution to the capacitance.
3. thicken the first polysilicon layer's top side oxide thickness to reduce capacitance contribution.
4. thicken the side wall oxide thickness without degrading tunneling characteristics.

The capacitance coupling efficiency in equation (7) can be estimated by assuming that $C_P$ is approximately equal to $C_E$ and similarly approximately equal to $C_C$. In the following equation, these other capacitances will therefore be substituted as defined in equation (7) with $C_0$. To further simplify equation (7), we assume that according to the present invention since the oxide thickness of capacitance $C_S$ can be chosen to have approximately one third the oxide thickness of $C_P$ or $C_E$, and further that it can be chosen to have an area of approximately 2.5 times that of $C_P$ or $C_E$, then $C_S$ is approximately 7.5 as large as either of these other capacitances. Therefore, the capacititive coupling efficiency portion of equation (7) can be rewritten as follows:

$$\begin{aligned}\text{Coupling Efficiency} &= (7.5C_0 + \tfrac{1}{2}C_0)/(7.5C_0 + 3C_0) \\ &= 8C_0/10.5C_0 \\ &= 0.76\end{aligned} \quad (8)$$

Thus, since the capacitive coupling efficiency is determined to be 0.76 or 76%, if we multiply this by the bit line voltage $V_{BL}$ of 16 volts, then the program/erase window size is approximately 12 volts. This figure is much higher than that obtainable from prior art three layer polysilicon memory cells operating even at higher voltages. For comparison, it should be noted that the best capacitive coupling efficiency available in a three layer polysilicon memory cell with comparable cell size are between 40% and 50% at best.

Figure 7A:
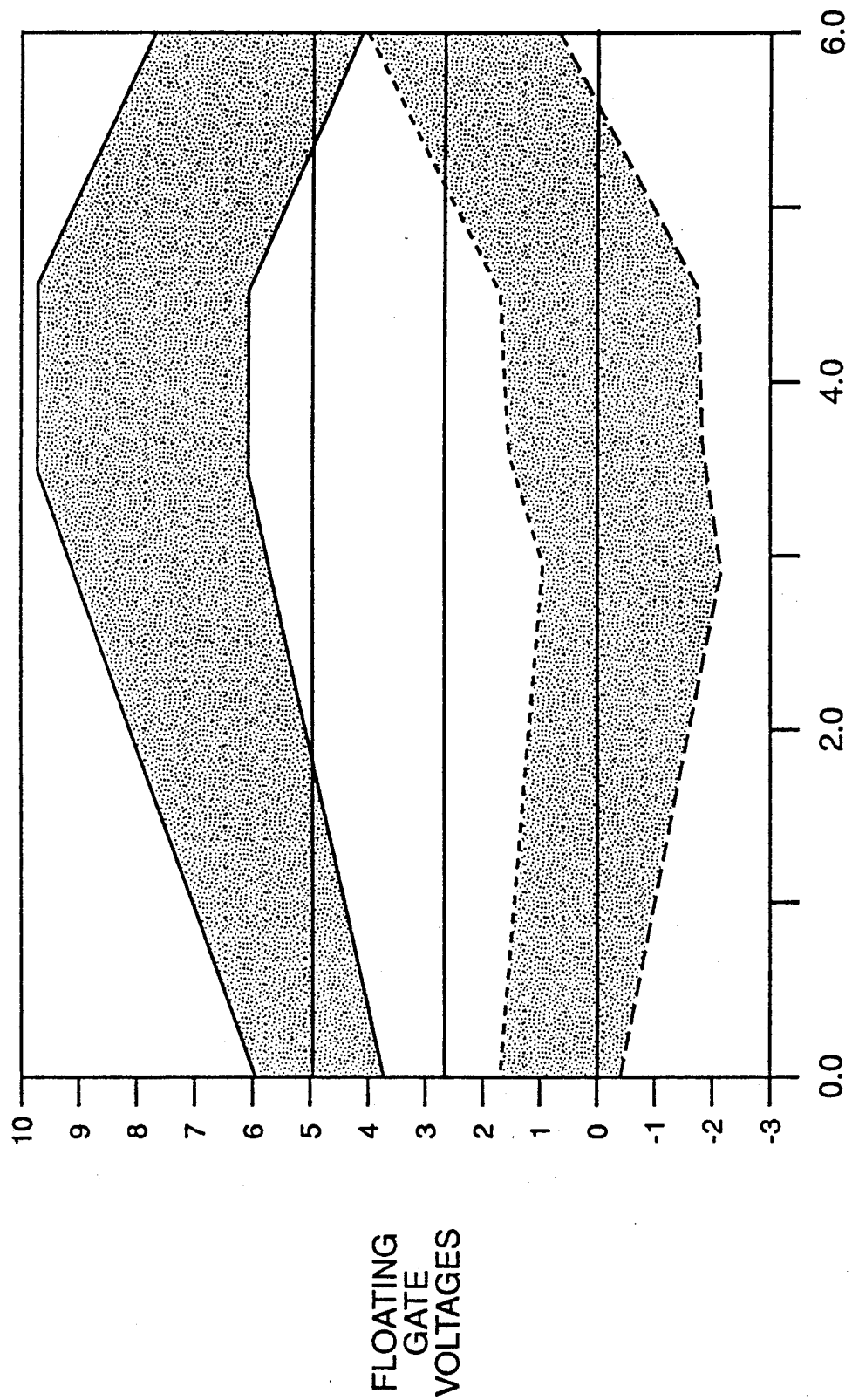
FIG. 7A is a graph of an exemplary program/erase window endurance curve for a prior art three polysilicon layer nonvolatile memory cell using a simplified computer model.
Figure 7B:
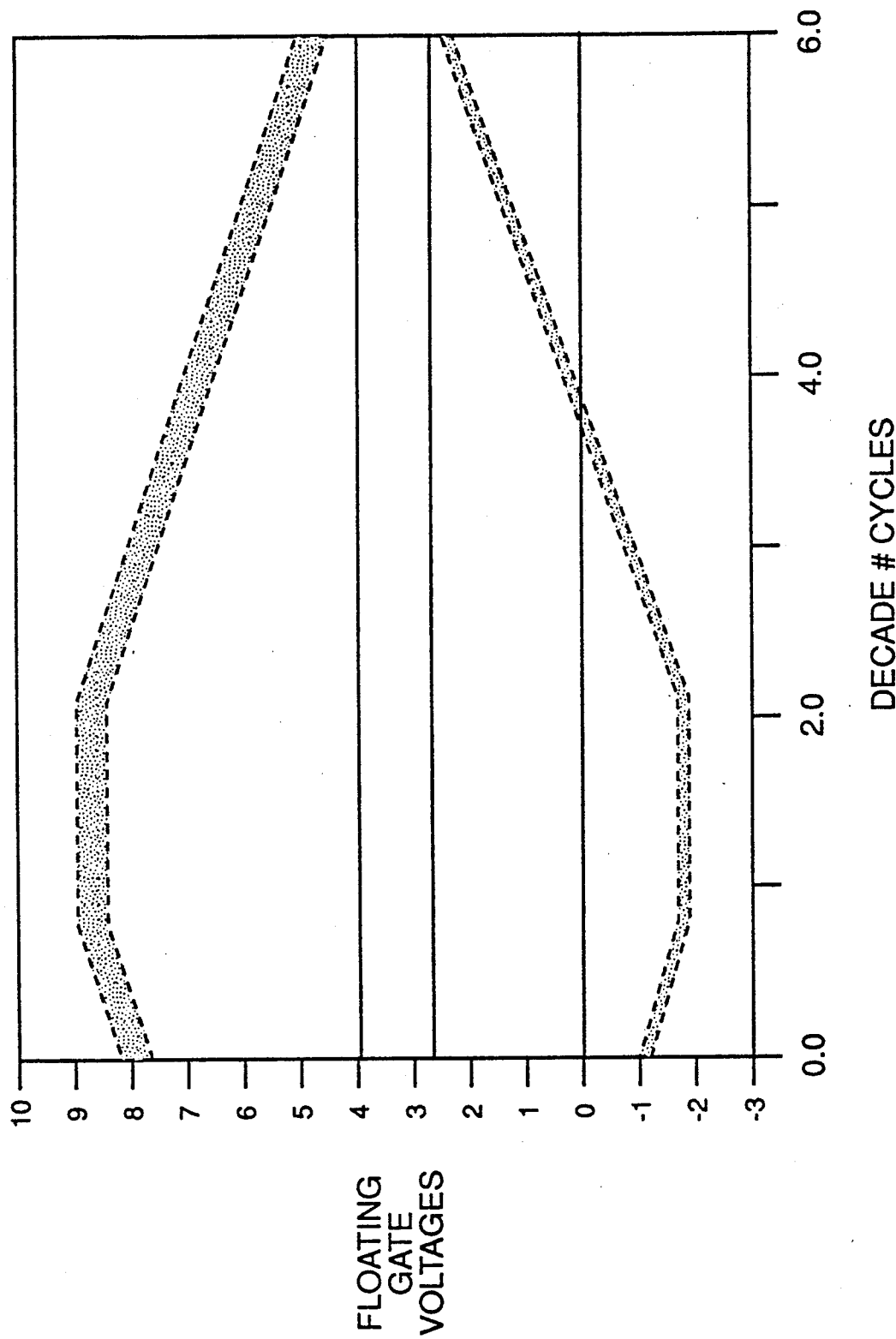
FIG. 7B is a graph of an exemplary program/erase window endurance curve for a two polysilicon layer nonvolatile memory cell according to the present invention based on the same computer model.

FIG. 7A is a graph of an exemplary program/erase window endurance curve for a three polysilicon layer nonvolatile floating gate memory cell based on a simplified computer model. This endurance curve illustrates the lifetime of this triple polysilicon layer cell. As can be seen, the x-axis of the graph illustrates the number of cycles that the floating gate memory cell can be put through until the cell no longer is able to have sufficient difference in charge on the floating gate to be operable as a memory element. The y-axis of the graph illustrates floating gate potential. The upper band in the graph of FIG. 7A illustrates the high and low limits of floating gate potential for a floating gate element in an erased state. As is seen, the erase floating gate potential varies initially between about 3.8 volts and 6 volts. A band of erased state potentials exists because of misalignment and tunneling parameters distribution in any statistical sampling of floating gates tested for this particular endurance curve. Similarly, the high and low limits of floating gate potential for a floating gate element in a programmed state is shown to begin at between minus 0.3 and plus 1.7 volts, again with a band that is a function of the misalignment of various elements in the floating gate memory cell and the tunneling parameters distribution. FIG. 7B illustrates the improvement obtained in the program/erase window for a two polysilicon memory cell according to the present invention. As can be seen, the window in FIG. 7B is both larger and provides a significantly increased cell lifetime. A goal of all floating gate memory designs is to maximize the size of a given memory cell's program/erase window for as large a number of cycles as possible.

By removing substrate region 16, as seen in FIGS. 6A and 6B, the floating gate channel region now extends to the area underneath the first portion of the first polysilicon layer 24 as illustrated in the nonvolatile memory cell 10" of FIG. 6A or 10'" of FIG. 6B. With substrate region 16 removed, the operation of the memory cell, and the final programming voltage level of the floating gate changes as follows.

Unlike substrate region 16, which can support the full high voltage of $V_{BL}$, the floating gate channel region 46 in nonvolatile memory cell 10" or 10'" can at most support a surface potential which is equivalent to $V_{FG} - V_T$ where $V_T$ is the threshold voltage of the floating gate channel (assuming that $V_T$ is the same under both the first portion of the first polysilicon layer 24 and the second portion of the second polysilicon layer 26). Beyond this value, any increase of $V_{BL}$ potential is consumed by the further depletion of the substrate region underneath the floating gate, leaving the surface potential only slightly increased.

Therefore, at programming of the nonvolatile memory cell 10" or 10'", when steady state is reached, the floating gate potential $V_{FG}(0)$ is given approximately by a modification to equation (1) discussed previously, as follows:

$$\begin{aligned}V_{FG}(0) &= [C_E V_{WL} + C_P V_R \\ &\quad + (C_S + C_C)(V_{FG}(0) - V_T) + Q_{FG}(0)]/\Sigma C \\ &= V_R + V_X\end{aligned} \quad (9)$$

When erasing the floating gate of FIG. 1 or FIG. 6, i.e. electrons are tunnelled from floating gate 50 to the first portion 24 of the second polysilicon layer, there is little functional difference between the embodiments of nonvolatile memory cell 10 and that of memory cell 10". Erasing occurs when first substrate region 14 is maintained at zero volts by the data potential $V_{BL}$. In cell 10", the surface potential of channel 46 under full inversion, i.e. where the substrate changes conductivity, provides the same function as the potential of second substrate region 16 in nonvolatile memory cell 10.

Therefore, at erasing of memory cell 10", when steady state is reached the floating gate potential $V_{FG}(1)$ is the same as that described by equation (2).

Consequently, the size of the program/erase window is given by:

$$\begin{aligned}\Delta Q_{FG}/\Sigma C &= (V_{WL} - V_R) - 2V_X + [(C_S + C_C)(V_{FG}(0) - V_T)]/ \\ &\quad \Sigma C\end{aligned}$$

which can be approximated, as before, by $$\begin{aligned}\Delta Q_{FG}/\Sigma C &= [(C_C + C_S)/\Sigma C] \times [V_{FG}(0) - V_T] \\ &= (\text{capacitance coupling efficiency}) \times [V_{FG}(0) - V_T]\end{aligned}$$

Using the same example as before and further assuming that:

$V_T = 2$ volts $V_{FG}(0) - V_T = V_{GL} + V_X - V_T = 6$ volts (coupling efficiency)$=8.5C_O/10.5C_O=0.81$.

Therefore, $\Delta Q_{FG}/\Sigma C=0.81\times 6$ volts. Thus, the window is only about 5 volts instead of the 12 volts calculated above for the window obtained with nonvolatile memory cell 10.

One should notice that in the program/erase window calculation, the voltage value was really based on the floating gate charge difference divided by a constant capacitance value, i.e. $\Sigma C=C_P+C_E+C_S+C_C$. That may not represent the actual capacitance condition when the floating gate channel is depleted. In that case, the window can be wider if the calculation is based on the floating gate potential difference at a given external terminal potential condition. Since the floating gate charge is not a function of external terminal potential, window size based on $\Delta Q_{FG}/\Sigma C$ is used herein for illustration.

In either nonvolatile memory cell 10 or nonvolatile memory cell 10'', the state of the floating gate 50 is sensed by applying a potential to the second portion 22 of first polysilicon layer sufficient to invert the conductivity type of channel 49, so that the potential of third substrate region 36 is coupled to channel 49. Another potential is applied to the first portion 24 of second polysilicon layer along control potential line $V_{WL}$ also sufficient to invert the conductivity type of channel 40 to couple either of second substrate region 16 of nonvolatile memory cell 10 or virtual junction 66 of nonvolatile memory cell 10'' to first substrate region 14. By applying a sense potential to data nodes represented by first substrate region 14, the sense potential will develop a sense current of value dependent on the conduction of transistor 44 at each data node, which represents one binary state. If the floating gate 50 is sufficiently programmed, i.e. with enough negative potential, the conductivity type of channel 46 will not be inverted, therefore leaving transistor 44 off, whereby no current is enabled between first substrate region 14 and third substrate region 36. However, if floating gate 50 is erased, i.e. it contains a positive potential, conductivity of channel 46 will be inverted, thereby turning transistor 44 on, whereby a current will be developed between first substrate region 14 and third substrate region 36. The state of the sense current represents the two binary states, programmed and erased, respectively.

In the case of memory cells 10'' and 10''', since the cutoff characteristics of floating gate transistor 44 are not as well established as that of floating gate transistor 44 in nonvolatile memory cell 10 for the programmed state of floating gate 50, a number of strategies may be employed to reliably sense this state. One approach would be to discriminate between the higher conduction level of the erased state and the lower conduction level of the programmed state, using an intermediate reference current combined with conventional differential sensing. A second approach would be to adjust the threshold of floating gate transistor 44 upward thereby retarding the turn-on characteristics of this transistor so that the floating gate transistor 44 is cut off when floating gate 50 is in the programmed state with a less positive potential as compared to the erased state. A third approach is to decrease $C_P$ relative to $C_E$ sufficiently to make $V_{FG}$ go more negative, resulting in full cutoff. It is within the ordinary skill of the art to provide such sense means in a memory array.

II. Method of Manufacture

Figure 8:
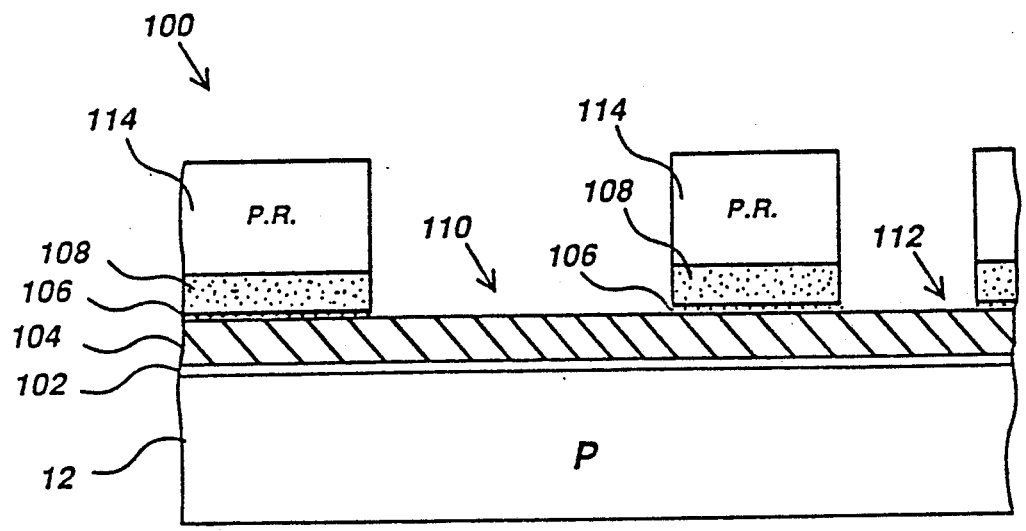
FIGS. 8 through 17 illustrate cross-sectional views of the preferred processing steps used in the formation of a memory cell according to the present invention as shown in FIGS. 1 or 4.

A. Memory Cell Using Two Layer Photoresist for Forming Floating Gate Sidewall Contact:

FIGS. 8-17 illustrate cross-sectional views of the processing steps used in the formation of a memory cell according to the present invention as shown in FIG. 4. Referring first to FIG. 8, illustrated is a substrate 12 on which various preliminary conventional processing steps have been completed. Shown grown on substrate 12 is thin oxide layer 102. The silicon dioxide layer 102 is preferably of a predetermined thickness so as to provide strong coupling between the substrate and the first polysilicon layer. A first polysilicon layer 104 is deposited on top of the silicon dioxide layer 102. A nitride layer 106 is then formed on the surface of the first polysilicon layer 104. An oxide layer 108 is deposited on top of nitride layer 106. Nitride layer 106 and oxide layer 108 enable doping of a predetermined area on the substrate so as to create a self-aligned paddle, as hereinafter described. The nitride layer 106 and the oxide layer 108 are then masked using a conventional layer of photoresist 114 to define where the first and second portions of said first polysilicon layer are to be formed, shown respectively at 110 and 112. FIG. 8 illustrates the state of the nonvolatile floating gate memory device 100 after a conventional etching step using mask 114 removes the nitride (and oxide) from these regions 110 and 112.

Figure 9:
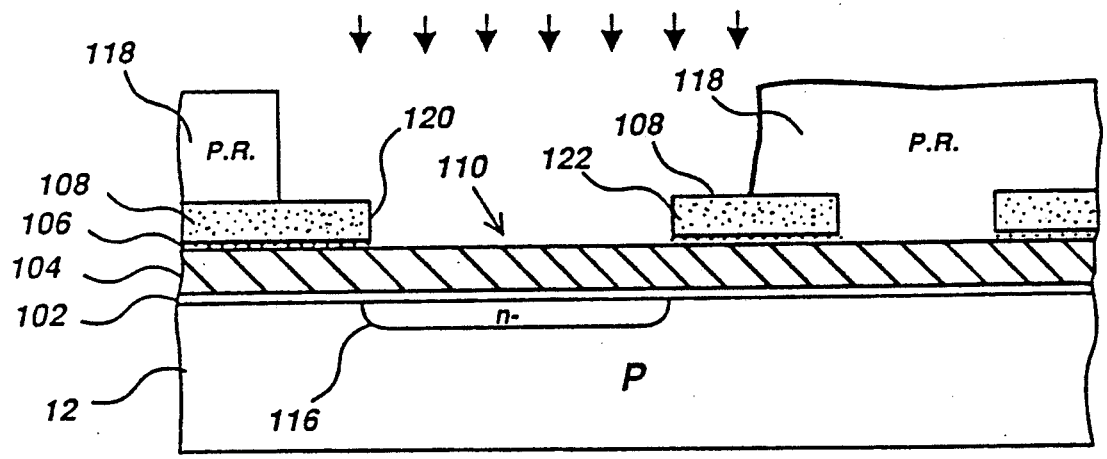

FIG. 9 illustrates the preferred, although optional, step of implanting a doped region 116 in the substrate 12. To insure that region 112 is not also doped, the original photoresist 114 is stripped from the surface of device 100 and a new photoresist 118 applied to form a mask over the exposed portion of said first polysilicon layer 112 corresponding to where the second portion of said first polysilicon layer is to be formed. The region to be doped is in correspondence to the window 110 formed in the photoresist such that region 116 in substrate 12 is doped with an n-type dopant, such as phosphorous.

According to an optional feature of the present invention, the edges 120, 122 of the oxide layer 108 act as a method and means for providing self-alignment of the doped region 116 under the first portion of said first polysilicon layer being formed. That is, edges 120 and 122 remain from the previous defined photoresist etch 114 and provide a means for blocking n-type doping of substrate 12 except in the window whose edges are defined by edges 120 and 122. The nitride layer 106 alone is not thick enough to block the doping ions and so would not provide this function.

The nitride layer 106 and oxide layer 108 together serve the purpose of defining a self-aligned paddle which helps reduce the cell size with a given design rule. If the self-aligned feature is not wanted, then the process can be simplified by implanting the paddle region with a mask before poly deposition. The poly can then be patterned directly with a mask, with a reverse tone to mask 114, without the deposition of nitride layer 106 and oxide layer 108 and the associated etching and oxidation steps.

The next process step is to remove mask 118 and the underlying oxide layer 108 using a conventional etch. Thus, the nitride layer 106 remains to define the regions of the first and second portions of the first polysilicon layer. Referring now to FIG. 10, as seen in that figure, a second silicon dioxide layer 124 is thermally grown in a conventional manner on the exposed surface areas of the first polysilicon layer 104. Only an insignificant amount of oxide forms on the surface of nitride layer 106. The oxide layer 124 formed on the exposed surface areas comprises a masking oxide for the next step which is to complete the formation of the first and second portions of said first polysilicon layer 104.

Figure 11:
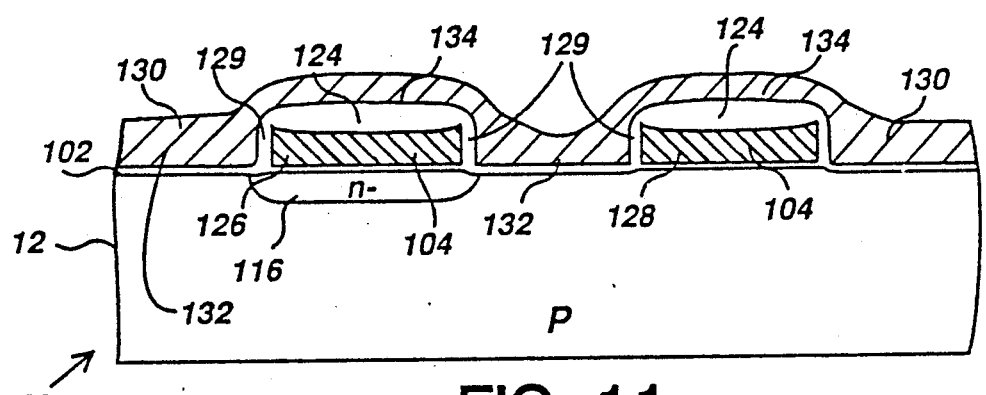

FIG. 11 illustrates the next step in the process, which is to strip the nitride layer 106 selectively with a wet etch and then use the oxide layer 124 as a mask for etching of the polysilicon layer 104 using a conventional anisotropic etch. This step is shown in FIG. 11 as having been completed, forming thereby first region 126 and second region 128 of first polysilicon layer 104. The etch is allowed to run until no polysilicon 104 exists between regions 126 and 128. Next, a layer of oxide is grown to cover the sides of first and second regions 126 and 128. This layer of oxide, shown at 129, later becomes part of the tunneling oxide for the cell 100. A thin layer of photoresist 130 is then formed using a conventional spin cycle to form a depth of approximately 3,000 Angstroms in regions 132 and a depth of approximately 1,000 Angstroms in regions 134. A key aspect of this step is to create a photoresist layer that is thinner at the top corners of the polysilicon layer, so as to enable easier exposure of one of these polysilicon corners for side wall contact, as described below.

Figure 12:
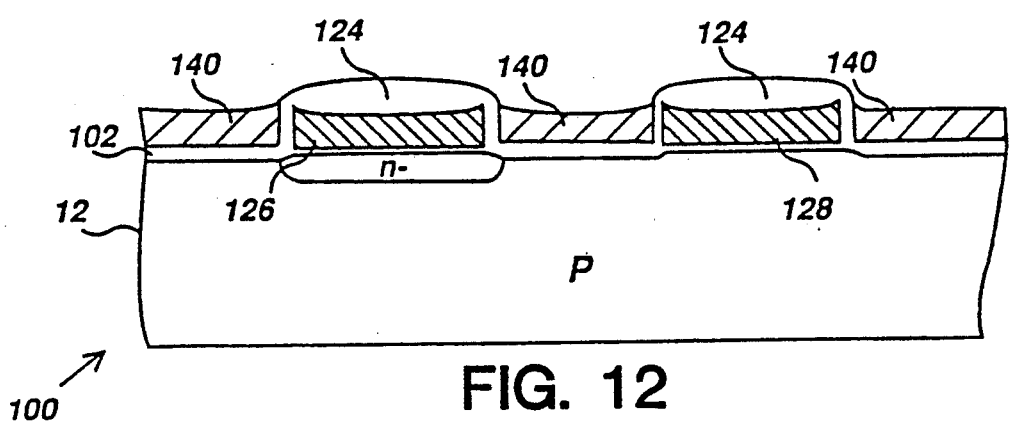
Figure 13:
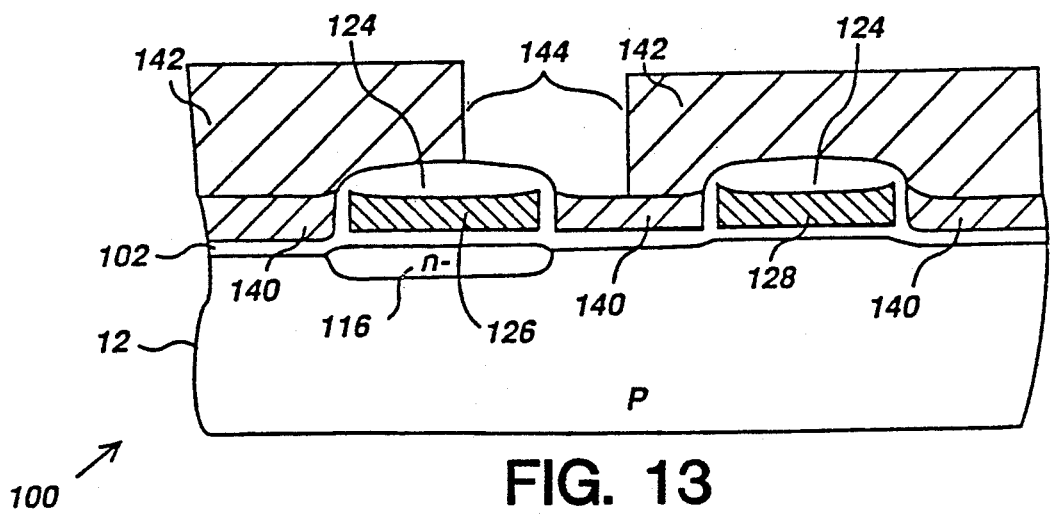

As shown in FIG. 12, the next step in the process is to remove the top portion of resist 130 so that the portion of the oxide 124 on top of the first and second regions 126 and 128 are exposed. This is done by conventional wet chemical etch. The remaining resist 140 is then baked so as to desensitize it to be no longer photosensitive so that a second layer of photoresist can be added on top of the original resist. A layer of photoresist 142, as shown in FIG. 13, is then added in a manner so as to mask the portions of the device 100 other than where the desired first portion of said second polysilicon layer is to be formed. As can be seen in FIG. 13, this region 144 overlies in part the first portion 126 of said first polysilicon layer.

In an alternative method step, instead of using a photoresist as the mask, a non-photosensitive material may be used, thus eliminating the need to desensitize the mask before a second mask is added as described above. This material would need to have similar viscosity and flow characteristics as for photo sensitive resists, to achieve the same thinning in regions 134 according to the present invention.

Figure 14:
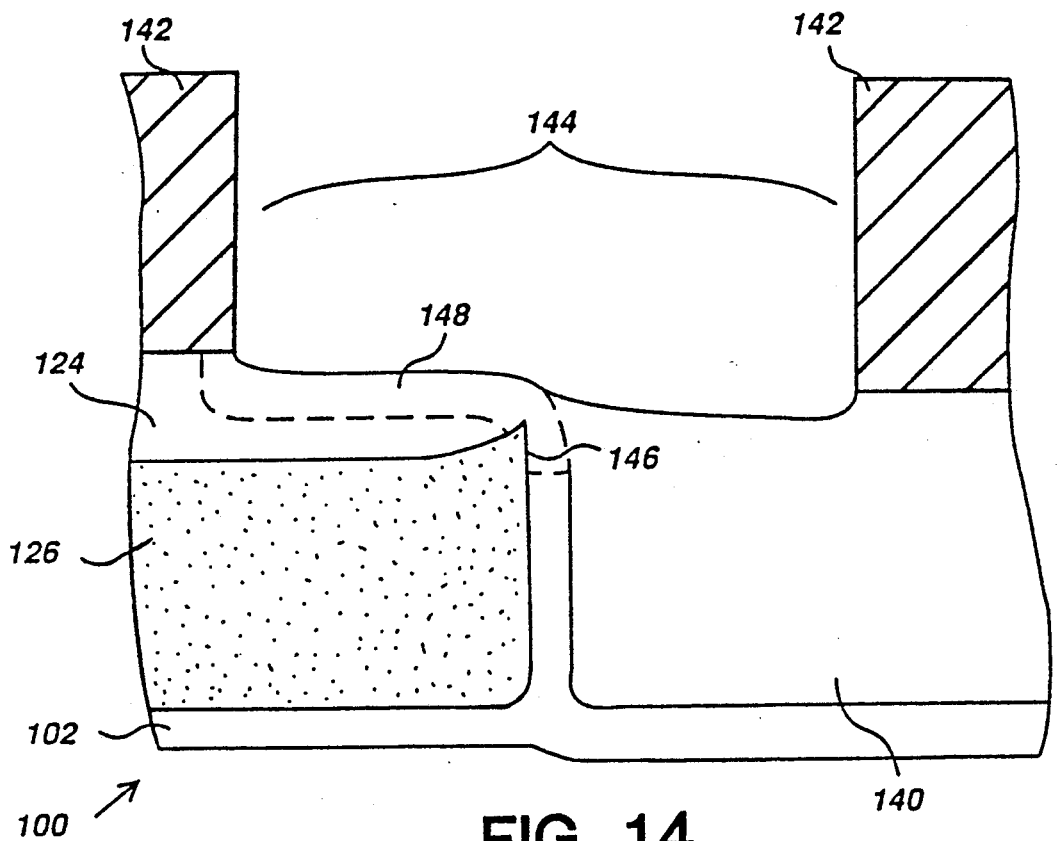
Figure 15:
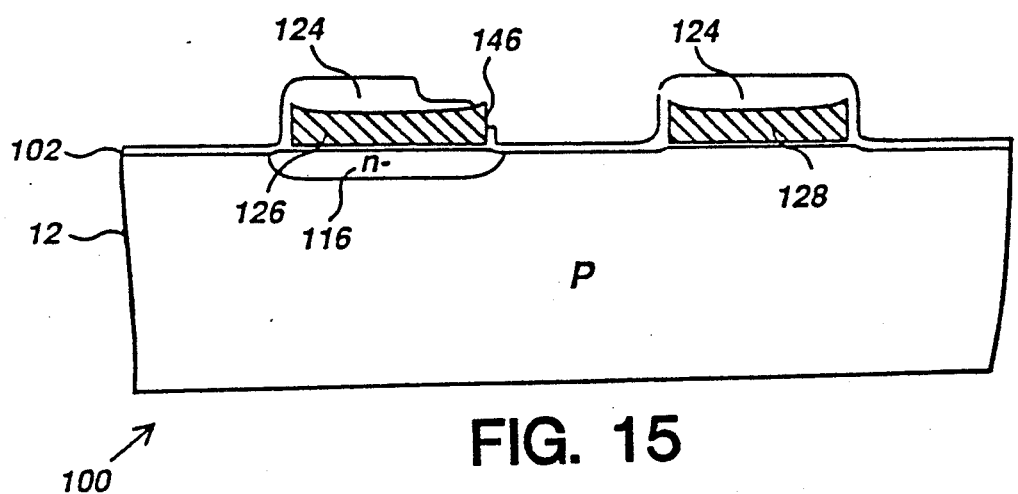
Figure 16:
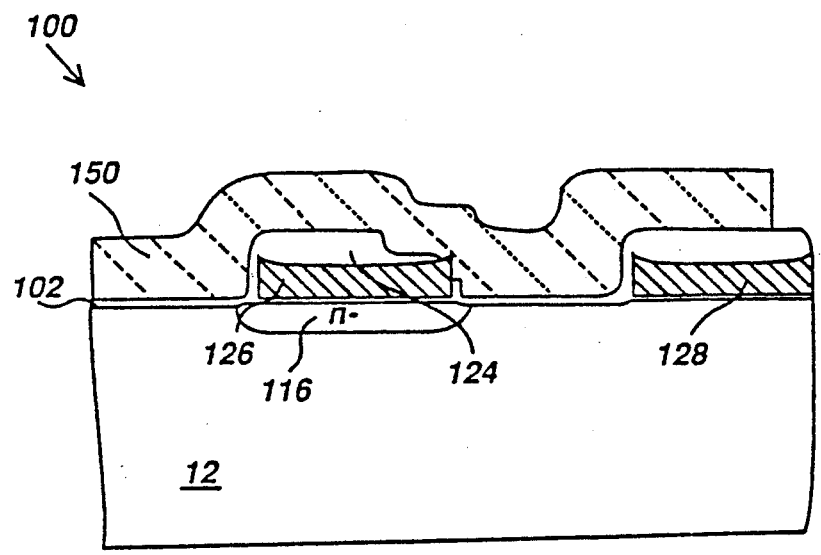

As seen in the more detailed view of FIG. 14, a portion of oxide layer 124 is exposed by the above process and this exposed oxide surface is then wet etched to remove an amount sufficient to expose a portion of the side wall 146 of the first portion 126 of said first polysilicon layer. After this oxide wet etch is completed, and the portion 148 of oxide layer 124 removed thereby, as seen in FIG. 15, the rest of the photoresist 140 and 142 is then removed leaving a portion of the side wall 146 of first portion 126 exposed. As shown in FIG. 16, a second layer 150 of polysilicon is then formed on all exposed surfaces of device 100.

Figure 17A:
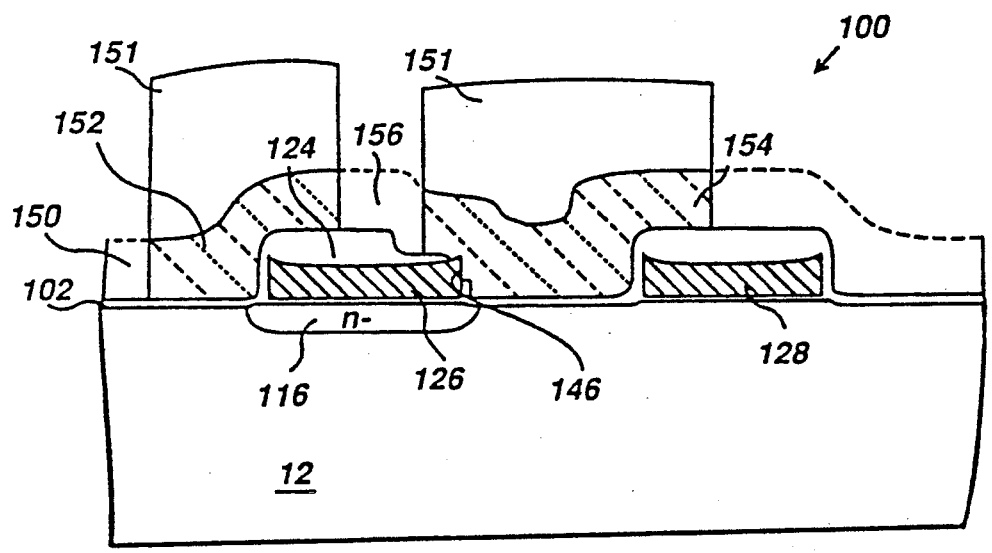
Figure 17B:
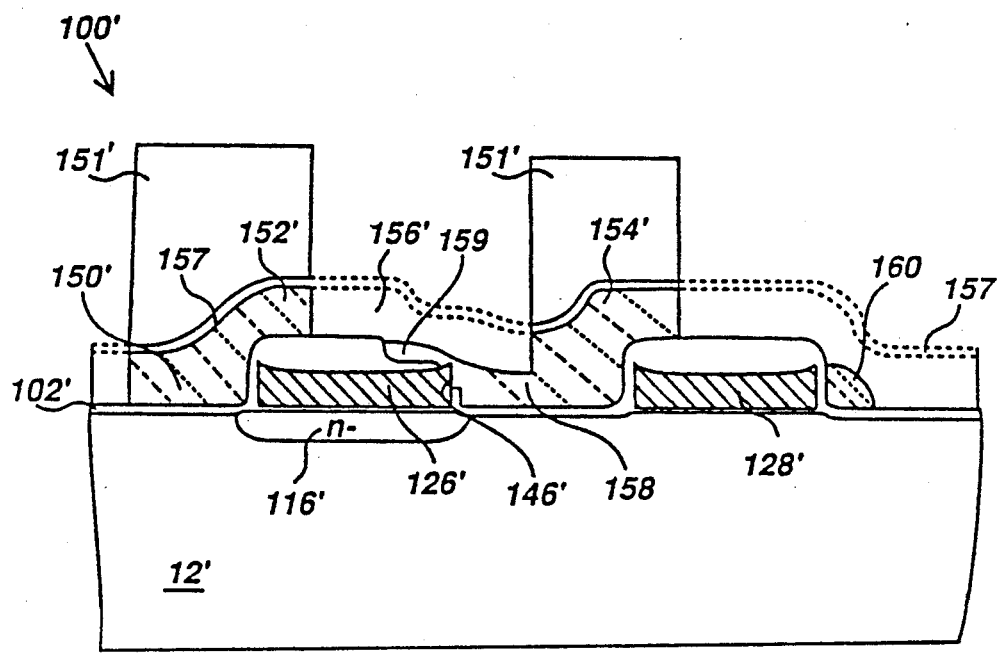
Figure 17C:
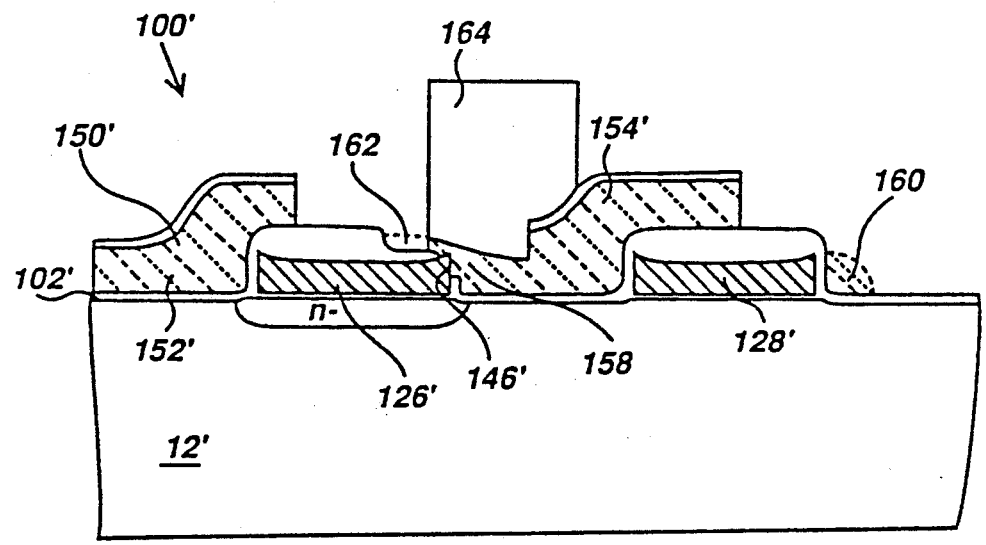

Two alternatives are shown in FIG. 17A and in FIGS. 17B and 17C for forming first and second regions in said second layer 150 of polysilicon according to the present invention. As seen in FIG. 17A, a photoresist layer 151 is added so as to provide a mask for forming first and second regions 152 and 154, respectively, of second polysilicon layer 150. The portion 156 of second polysilicon layer 150 that is exposed by the photoresist layer 151 (and which is shown in phantom) is then etched so as to form the separate portions 152 and 154.

An alternative way of patterning the second polysilicon layer 150 to make a more compact memory cell is shown in FIGS. 17B and 17C. In these figures, structures analogous to those in FIG. 17A are shown with a prime. Two additional steps are required: (1) a masking oxide 157 needs to be formed before adding the mask 151; (2) after etching of the second polysilicon layer 150 with end point detection, a second mask 164 (a bridge protection mask) is required, as shown in FIG. 17C, to mask the "poly 2 bridge", shown at 158, during the removal of the unwanted poly "stringer", shown at 160. Only an insignificant amount of the poly 2 bridge 158 would be removed during this step, as shown at 162. The reason that cell 100' is more compact can be seen from FIG. 17B, since it illustrates that a substantial part, if not all of second portion 154 of the second polysilicon layer that overlies first portion 126 as shown in FIG. 17A has been eliminated.

Depending on how much of the second polysilicon layer is etched away in the FIG. 17B, 17C method as described above, a portion 159 may remain on the top surface of the first portion 126 of first polysilicon layer. However, the process could also cut deeper into portion 154 to remove all portions of such a leg. So long as sufficient contact remains between portion 154 to make contact with side wall 146, the memory cell 100' will still be operative. Note that this portion 159 is not the same as the overlap created by the second portion 26 of the second polysilicon layer, shown in FIG. 1. In the latter case, as shown in FIG. 17A, processing is greatly simplified from the above, e.g., no etch back to an etch stop is required, nor is a bridge protect mask required. The overlap of second portion 26 in FIG. 1 is created by a simple mask and etch back step. The advantage of the above described more complex bridge forming process is that a more compact memory cell is created as compared with a memory cell wherein an overlap is formed.

Figure 18:
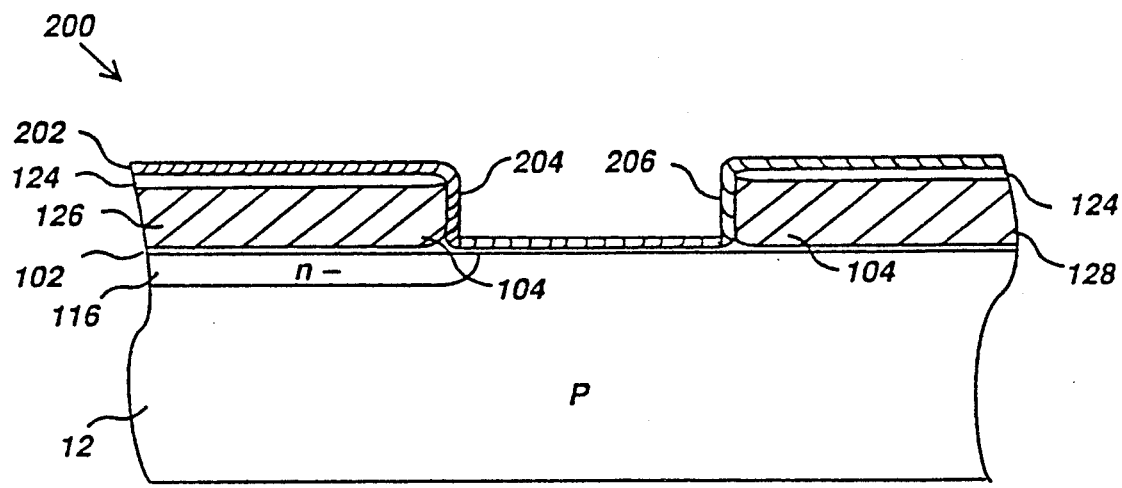
FIGS. 18-20 illustrate cross-sectional views of alternative processing steps for forming a side wall according to the present invention.
Figure 19:
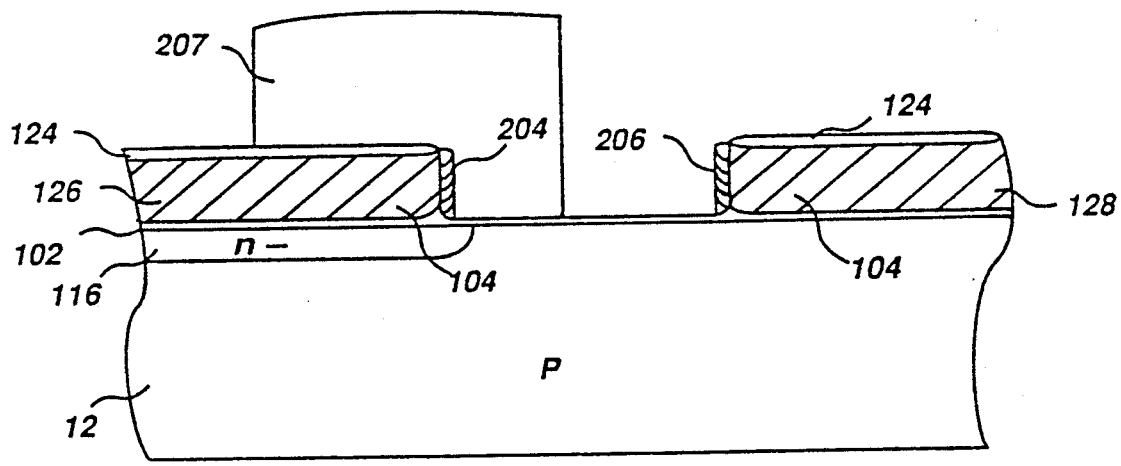
Figure 20:
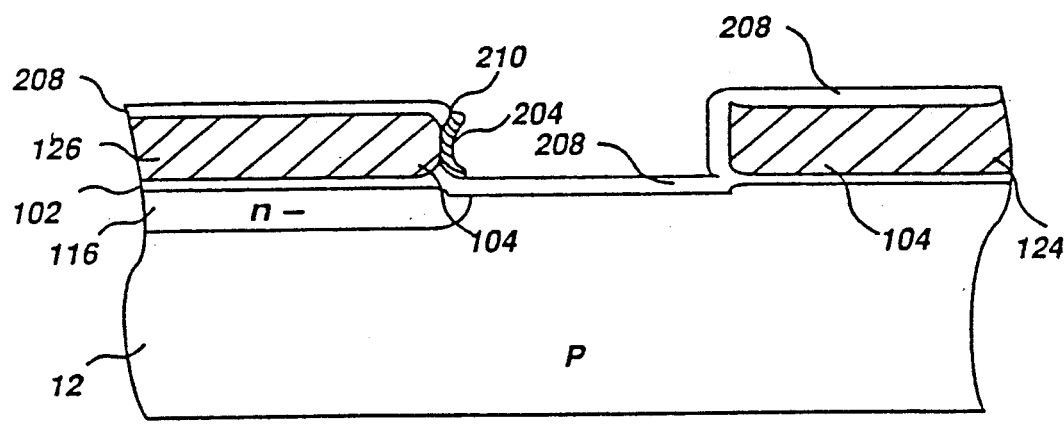

B. Memory Cell Using Nitride for Forming Floating Gate Sidewall:

An alternative series of processing steps for forming a side wall connection as above described according to the present invention is illustrated in the cross-sectional views shown in FIGS. 18-20. Referring first to FIG. 18, this step shows that another layer of nitride 202 is formed on the cell 200. This is instead of the steps, described above and shown in FIG. 11, of providing a oxide layer 124 around both first and second portions 126 and 128 of first polysilicon layer 104. The nitride layer 202 is then removed from all surface areas except for the side wall portion 204 and 206 of the first polysilicon layer 104 with an anisotropic process. As seen in FIG. 19, a mask step is then performed to place photoresist 207 over the side wall 204 leaving side wall 206 exposed. An isotropic etch is then used to remove this exposed nitride 206, using an etch of sufficient selectivity so as not to attack oxide layer 124.

Photoresist 207 is then removed and a tunnel oxide grown over all exposed surfaces as shown at 208. Note that oxide 102 is of a predetermined smaller thickness that is retained between first portion 126 of first polysilicon layer 104 and substrate region 116. Note also that there is some minor reoxide encroachment, as at 210 between first portion 126 and nitride side wall 204. The next step is to remove the nitride side wall 204 using a standard wet etch and then proceed with depositing the second layer of polysilicon as described above beginning with FIG. 16.

The present invention has been described utilizing n-channel technology. It is within the ordinary skill of the art to use p-channel technology. In this regard, the potential described above would be opposite in polarity. It will be appreciated that other variations and modifications to the present invention may be made without departing from the inventive concepts described herein. Accordingly, the present invention is to be limited solely by the scope of the appended claims.

What is claimed is:

1. An integrated circuit device comprising:
   a substrate of a first conductivity type having a first surface;
   a first polysilicon layer spaced from said first surface, and including a first portion and a second portion electrically insulated from said first portion, said first portion having a planar bottom surface spaced from said substrate and having at least one side wall substantially perpendicular to said bottom surface; and
   a second polysilicon layer having a first portion spaced from said first surface and a second portion electrically insulated from said first portion of said second polysilicon layer, said second portion of said second polysilicon layer having at least one surface in electrical contact with said side wall.

2. The integrated circuit device of claim 1 wherein said substrate includes a first substrate region and a second substrate region, each region of a second conductivity type opposite said first conductivity type, each said substrate region being disposed in said first surface and having predetermined boundaries, and wherein the boundaries of said first portion of said first polysilicon layer are aligned with the boundaries of said second substrate region.

3. The integrated circuit device of claim 1 wherein said substrate includes a first substrate region and a second substrate region, each region of a second conductivity type opposite said first conductivity type, each said substrate region being disposed in said first surface and having predetermined boundaries, and wherein said first portion of said first polysilicon layer is capacitively coupled to said second substrate region.

4. The integrated circuit device of claim 1 wherein said second portion of said second polysilicon layer partially overlaps and is in contact with a top surface of said first portion of said first polysilicon layer.

5. The integrated circuit device of claim 2 wherein said second portion of said second polysilicon layer contacts only said side wall of said first portion of said first polysilicon layer.

6. The integrated circuit device of claim 5 wherein said second portion of said second polysilicon layer contacts only a portion of said side wall of said first portion of said first polysilicon layer.

7. The integrated circuit device of claim 1 wherein said second portion of said second polysilicon layer is defined such that no portion thereof crosses a vertical plane defined by the side wall of said first conducting layer.

8. A nonvolatile electrically alterable memory cell comprising:
   a substrate layer of a first conductivity type having a first surface and including a first substrate region disposed in said first surface and being of a second conductivity type opposite said first conductivity type;
   a first silicon dioxide layer on said first surface having a predetermined first thickness;
   a first polysilicon layer formed on said first silicon dioxide layer, and including a first portion and a second portion, said first and second portions being electrically isolated from each other and spaced from said first substrate region, said first portion having at least one side wall substantially perpendicular to said first surface;
   a second silicon dioxide layer on said first and second portions of said first polysilicon layer except on at least a portion of said side wall, and having a predetermined second thickness;
   a second polysilicon layer on said second silicon dioxide layer, and including a first portion extending between said first substrate region and said first portion of said first polysilicon layer and overlapping a predetermined portion of said first portion of said first polysilicon layer, and a second portion having at least one surface in electrical contact with said side wall and extending between said first and second portions of said first polysilicon layer and overlapping said second portion of said first polysilicon layer a predetermined amount, said first and second portions of said second polysilicon layer being electrically isolated from each other.

9. The nonvolatile electrically alterable memory cell of claim 8 wherein said second silicon dioxide layer is thicker than said first silicon dioxide layer.

10. A nonvolatile electrically alterable memory cell comprising:
   a substrate of a first conductivity type having a first surface, and including a first substrate region and a second substrate region, each said substrate region being disposed in said first surface and being of a second conductivity type opposite said first conductivity type;
   means for selectively applying one of a first data potential and a second data potential to said first substrate region, said first data potential being applied when data to be stored in said cell has one binary state, said second data potential being applied when data to be stored in said cell has the other binary state;
   a first electrically insulated polysilicon layer spaced from said first surface, and including a first portion capacitively coupled to said second substrate region and a second portion electrically insulated from said first portion, said first portion having a planar bottom surface parallel to said first surface of said substrate and having at least one side wall substantially perpendicular to said bottom surface;
   a second electrically insulated polysilicon layer having a first portion extending between said first substrate region and said second substrate region and being spaced from said first surface and being capacitively coupled to said first portion of said first polysilicon layer, and a second portion electrically insulated from said first portion of said second polysilicon layer, said second portion of said second polysilicon layer being capacitively coupled to said second portion of said first polysilicon layer and having at least one surface in electrical contact with said side wall;
   means for selectively applying a first bias potential to said second portion of said first polysilicon layer;

means for selectively applying a control potential to said first portion of said second polysilicon layer, said control potential being selected to invert the conductivity type of said substrate between each said substrate region to said second conductivity type to electrically couple the potential of said first substrate region to said second substrate region, said control potential, said first and second data potentials and said bias potential being selected so that electrons are introduced onto said second portion of said second polysilicon layer from said second portion of said first polysilicon layer upon application of said first data potential to said first substrate region and said control potential to said first portion of said second polysilicon layer for storing said one binary state, and further selected so that electrons are removed from said first portion of said first polysilicon layer upon application of said second data potential to said first substrate region and said control potential to said first portion of said second polysilicon layer for storing said other binary state; and means for sensing the potential of said first portion of said first polysilicon layer.

11. The nonvolatile electrically alterable memory cell of claim 10 wherein the boundaries of said second substrate region are aligned with the boundaries of said first portion of said first polysilicon layer.

12. The nonvolatile electrically alterable memory cell of claim 10 wherein said second portion of said second polysilicon layer partially overlaps said first portion of said first polysilicon layer.

13. The nonvolatile electrically alterable memory cell of claim 12 wherein the boundaries of said second substrate region are aligned with the boundaries of said first portion of said first polysilicon layer.

14. The nonvolatile electrically alterable memory cell of claim 10 said second portion of said second polysilicon layer contacts only said side wall of said first portion of said first polysilicon layer.

15. The nonvolatile electrically alterable memory cell of claim 14 wherein said second portion of said second polysilicon layer contacts only a portion of said side wall of said first portion of said first polysilicon layer.

16. The nonvolatile electrically alterable memory cell of claim 14 wherein the boundaries of said second substrate region are aligned with the boundaries of said first portion of said first polysilicon layer.

17. The nonvolatile electrically alterable memory cell of claim 10 wherein said second portion of said first polysilicon layer comprises the programming electrode of said memory cell, the first portion of said first polysilicon layer and the second portion of said second polysilicon layer comprise the floating gate of said memory cell, and the first portion of said second polysilicon layer comprises an erase electrode for said memory cell.

18. A nonvolatile electrically alterable memory cell comprising:

a substrate of a first conductivity type having a first surface and a first substrate region said substrate region being disposed in said first surface and being of a second conductivity type opposite said first conductivity type;

means for selectively applying one of a first data potential and a second data potential to said first substrate region, said first data potential being applied when data to be stored in said cell has one binary state, said second data potential being applied when data to be stored in said cell has the other binary state;

a first electrically insulated polysilicon layer spaced from said first surface, and including a first portion and a second portion, said first and second portions being electrically isolated from each other and spaced from said first substrate region, said first portion having a planar bottom surface parallel to said first surface of said substrate and having at least one side wall substantially perpendicular to said bottom surface;

a second electrically insulated polysilicon layer spaced from said first surface and having a first portion extending between said first substrate region and said first portion of said first polysilicon layer and overlapping a predetermined portion of said first portion of said first polysilicon layer, and being capacitively coupled to said first portion of said first polysilicon layer, and a second portion electrically insulated from said first portion of said second polysilicon layer, said second portion of said second polysilicon layer being capacitvely coupled to said second portion of said first polysilicon layer and having at least one surface in electrical contact with said side wall;

means for selectively applying a first bias potential to said second portion of said first polysilicon layer;

means for selectively applying a first control potential to said first portion of said second polysilicon layer, said control potential, said data potential, and said bias potential being selected so that electrons are introduced onto said second portion of said second polysilicon layer from said second portion of said first polysilicon layer upon application of said first data potential to said first substrate region and said control potential to said first portion of said second polysilicon layer for storing said one binary state, and further selected so that electrons are removed from said first portion of said first polysilicon layer upon application of said second data potential to said first substrate region and said control potential to said first portion of said second polysilicon layer for storing said other binary state; and means for sensing the potential of said first portion of first polysilicon layer.

19. The nonvolatile electrically alterable memory cell of claim 18 wherein said second portion of said second polysilicon layer partially overlaps said first portion of said first polysilicon layer.

20. The nonvolatile electrically alterable memory cell of claim 18 wherein said second portion of said second polysilicon layer contacts only said side wall of said first portion of said first polysilicon layer.

21. The nonvolatile electrically alterable memory cell of claim 20 wherein said second portion of said second polysilicon layer contacts only a portion of said side wall of said first portion of said first polysilicon layer.

* * * * *